US012340869B2

(12) United States Patent
Jain et al.

(10) Patent No.: US 12,340,869 B2
(45) Date of Patent: Jun. 24, 2025

(54) LOW POWER WAKE UP FOR MEMORY

(71) Applicant: Taiwan Semiconductor Manufacturing Company, Ltd., Hsinchu (TW)

(72) Inventors: Sanjeev Kumar Jain, Kanata (CA); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 41 days.

(21) Appl. No.: 18/518,157

(22) Filed: Nov. 22, 2023

(65) Prior Publication Data

US 2024/0087618 A1    Mar. 14, 2024

Related U.S. Application Data

(63) Continuation of application No. 17/714,754, filed on Apr. 6, 2022, now Pat. No. 11,854,587.

(Continued)

(51) Int. Cl.
*G11C 7/10*    (2006.01)
*G11C 5/14*    (2006.01)

(52) U.S. Cl.
CPC ............ *G11C 7/1063* (2013.01); *G11C 5/14* (2013.01); *G11C 7/1066* (2013.01); *G11C 7/1093* (2013.01); *G11C 2207/2227* (2013.01)

(58) Field of Classification Search
CPC ... G11C 7/1063; G11C 7/1066; G11C 7/1093; G11C 5/14; G11C 2207/2227
See application file for complete search history.

(56) References Cited

U.S. PATENT DOCUMENTS 6,735,142 B1 * 5/2004 Oh .......................... G11C 7/22
327/143
7,193,921 B2    3/2007 Choi et al.
(Continued)

FOREIGN PATENT DOCUMENTS

CN       109155888 A      1/2019
KR    1020050123400 A    12/2005
TW       202142999 A     11/2021

OTHER PUBLICATIONS

Office Action issued in connection with Korean Appl. No. 10-2022-0066130 dated Apr. 25, 2024.
(Continued)

*Primary Examiner* — Son L Mai
(74) *Attorney, Agent, or Firm* — FOLEY & LARDNER LLP

(57) ABSTRACT

Disclosed herein are related to reducing power consumption of a memory device when transitioning from a sleep state to an operational state. In one aspect, the memory device includes a memory cell to store data. In one aspect, the memory device includes an output driver configured to: generate an output signal indicating the stored data, in response to a sleep tracking signal indicating that the memory cell is in the operational state, and generate the output signal having a predetermined voltage irrespective of the stored data, in response to the sleep tracking signal indicating that the memory cell is in the sleep state. In one aspect, the sleep tracking signal is delayed from a sleep control signal causing the memory cell to operate in the sleep state or the operational state.

20 Claims, 13 Drawing Sheets

Related U.S. Application Data

(60) Provisional application No. 63/285,883, filed on Dec. 3, 2021.

(56) References Cited

U.S. PATENT DOCUMENTS

| | | |
|---|---|---|
| 8,331,188 B2 | 12/2012 | Nakaoka |
| 9,270,262 B2 | 2/2016 | Tsai et al. |
| 9,529,713 B2 * | 12/2016 | Grunzke .................. G06F 13/16 |
| 11,545,192 B2 | 1/2023 | Wan et al. |
| 11,854,587 B2 * | 12/2023 | Jain ......................... G11C 5/14 |
| 2010/0188922 A1 | 7/2010 | Nakaoka |
| 2014/0184165 A1 | 7/2014 | Takahashi et al. |
| 2014/0354346 A1 | 12/2014 | Tsai et al. |
| 2020/0135246 A1 | 4/2020 | Bartling et al. |

OTHER PUBLICATIONS

Notice of Allowance on U.S. Appl. No. 17/714,754 DTD Aug. 22, 2023.
Office Action issued in connection with Taiwan Appl. No. 111133311 dated Sep. 13, 2023.

* cited by examiner

900C

900D

LOW POWER WAKE UP FOR MEMORY

CROSS-REFERENCE TO RELATED APPLICATION

This application is a Continuation application of U.S. patent application Ser. No. 17/714,754, filed Apr. 6, 2022, which claims the benefit of and priority to U.S. Provisional Patent Application No. 63/285,883, filed Dec. 3, 2021, each of which is incorporated herein by reference in its entirety.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
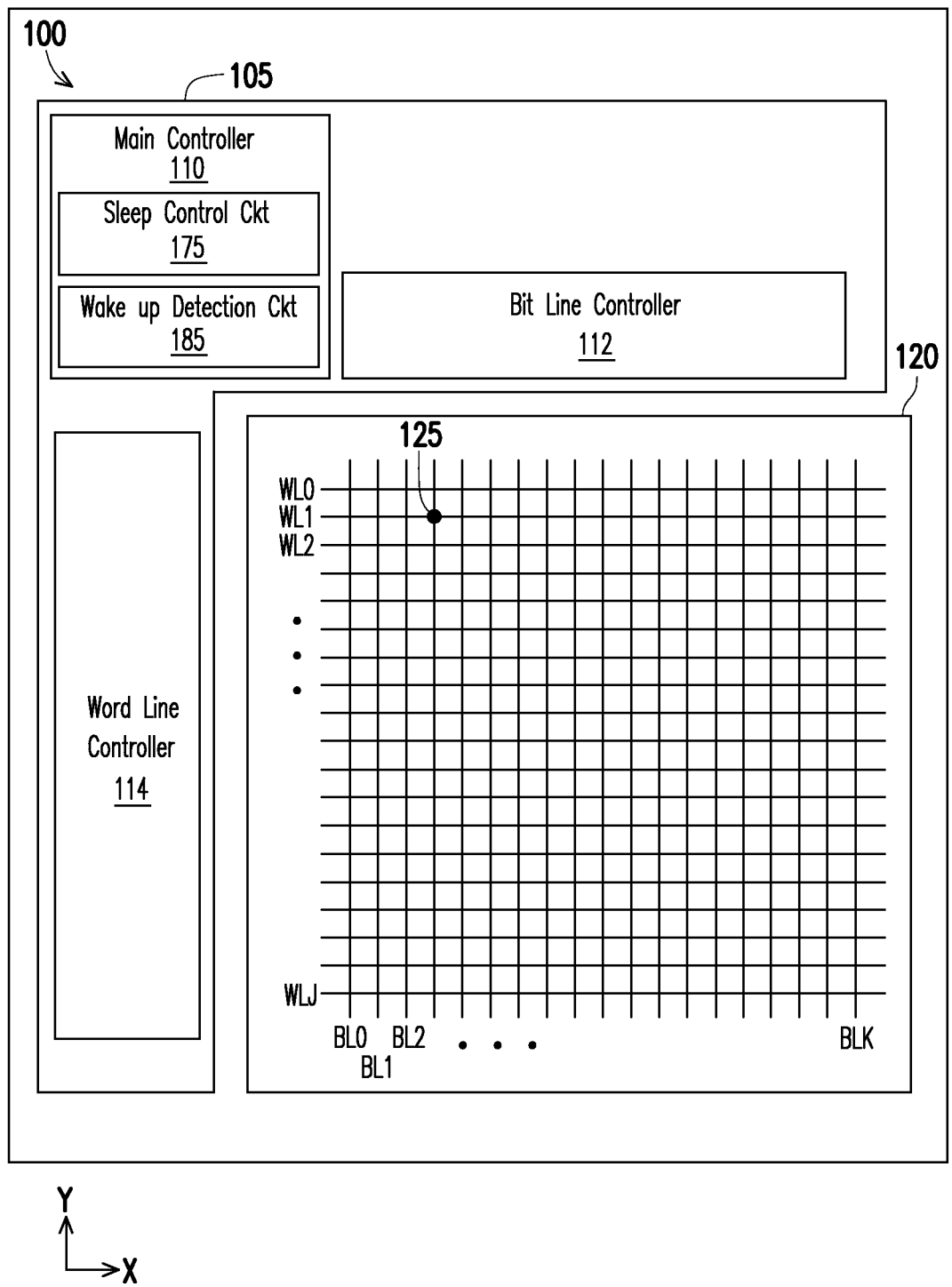
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to reducing power consumption of a memory device when transitioning from a sleep state to an operational state. In one aspect, the memory device includes a memory cell to store data. In one aspect, the memory device includes an output driver configured to: generate an output signal indicating the stored data, in response to a sleep tracking signal indicating that the memory cell is in the operational state, and generate the output signal having a predetermined voltage irrespective of the stored data, in response to the sleep tracking signal indicating that the memory cell is in the sleep state. In one aspect, the sleep tracking signal is delayed from a sleep control signal causing the memory cell to enter the sleep state or the operational state.

Advantageously, the memory device can reduce power consumption when transitioning from the sleep state to the operational state. In one aspect, the controller may generate the sleep control signal causing the memory cell to enter the sleep state or the operational state. In response to the sleep control signal, the memory cell may enter the sleep state or the operational state accordingly. In one aspect, the sleep control signal is propagated through a number of buffer circuits to cause a set of memory cells to enter the sleep state or the operational state. For example, a first buffer circuit can receive the sleep control signal and generate a first delayed control signal to configure a first subset of the set of memory cells in the sleep state or the operational state. Each remaining buffer circuit can receive a delayed control signal from a preceding buffer circuit and generate a corresponding delayed control signal to configure a corresponding subset of the set of memory cells in the sleep state or the operational state. The sleep control signal propagated through the last buffer circuit of the set of buffer circuits may be a sleep tracking signal indicating the status of the set of memory cells indicating whether a transition from the sleep state to the operational state by the set of memory cells is complete. The sleep tracking signal may be delayed with respect to the sleep control signal, due to a capacitive load of the memory cells and/or the number of buffer circuits. In one aspect, causing the output driver to generate the output signal having the predetermined voltage in response to the sleep control signal may cause the output driver to consume power when the memory cell has not sufficiently transitioned from the sleep state to the operational state. By causing the output driver to generate the output signal having the predetermined voltage in response to the sleep tracking signal, power consumption of the output driver when the memory cell has not sufficiently transitioned from the sleep state to the operational state can be reduced or obviated.

In one aspect, the memory device includes a delay circuit to delay the sleep tracking signal. The memory device may further include a wake-up detection circuit coupled to the delay circuit. The wake-up detection circuit may generate a wake-up complete signal indicating whether a transition from the sleep state to the operational state by the memory cell is complete, based on the delayed sleep tracking signal. For example, the wake-up complete signal may have a high voltage (e.g., 1V) to indicate that the transition from the sleep state to the operational state by the memory cell is incomplete, in response to the delayed sleep tracking signal having a high voltage (e.g., 1V) indicating that the memory cell is in a sleep state. For example, the wake-up complete signal may have a low voltage (e.g., 0V) to indicate that the transition from the sleep state to the operational state by the memory cell is complete, in response to the delayed sleep tracking signal having a low voltage (e.g., 0V) or logic value '0' indicating that the memory cell is in the operational state.

In one aspect, the memory device includes a power detection circuit configured to detect an internal supply voltage provided to one or more circuits in the output driver, and to generate a power detection signal indicating whether the internal supply voltage has reached a threshold voltage. The wake-up detection circuit may generate the wake-up complete signal, further based on the power detection signal. For example, the wake-up complete signal may have a high voltage (e.g., 1V) to indicate that the transition from the sleep state to the operational state by the memory cell is incomplete, in response to the power detection signal having a high voltage (e.g., 1V) indicating that the internal supply voltage has not reached a threshold voltage. For example, the wake-up complete signal may have a low voltage (e.g., 0V) to indicate that the transition from the sleep state to the operational state by the memory cell is complete, in response to the power detection signal having a low voltage (e.g., 0V) indicating that the internal supply voltage has reached the threshold voltage.

Advantageously, the wake-up detection circuit may generate the wake up complete signal accurately, when the memory cell and the output driver have transitioned from the sleep state to the operational state. In one aspect, the internal supply voltage provided to the one or more circuits of the output driver may change, in response to the sleep control signal. For example, the internal supply voltage may be set to a first voltage (e.g., 0V) when the output driver is in the sleep state, and may be set to a second voltage (e.g., 1V) when the output driver is in the operational state. Due to capacitive loading, the change in the internal supply voltage may be delayed with respect to the change in the sleep control signal. By causing the wake-up detection circuit to generate the wake-up complete signal based on the delayed sleep tracking signal and/or the power detection signal, the wake up complete signal can be generated accurately when the internal supply voltage has reached a sufficient voltage for the output driver to be operational. Accordingly, prematurely causing other operations such as reading data stored by the memory cell before the memory cell and the output driver have sufficiently transitioned from the sleep state to the operational state can be obviated, such that the memory device can operate in a reliable manner with reduced power consumption.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two or three dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one aspect, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a main controller 110. The bit line controller 112, the word line controller 114, and the main controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120.

In one configuration, the main controller 110 is a circuit that provides control signals or clock signals to synchronize operations of the bit line controller 112 and the word line controller 114. In some embodiments, the main controller 110 is embodied as or include a processor and a non-transitory computer readable medium storing instructions when executed by the processor cause the processor to execute one or more functions of the main controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the main controller 110 may generate control signals to coordinate operations of the bit line controller 112 and the word line controller 114. For example, the main controller 110 may generate one or more enable signals to enable or disable operations of the bit line controller 112 and/or the word line controller 114. In one approach, to write data to a memory cell 125, the main controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the main controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

In some embodiments, the main controller 110 includes a sleep control circuit 175 and a wake-up detection circuit 185. Through these components, the main controller 110 may perform a wake up sequence and report a status of the memory device 100.

The sleep control circuit 175 is a circuit that generates a sleep control signal to cause the memory cells 125 and one or more components (e.g., bit line controller 112 and the word line controller 114) of the memory controller 105 to enter a sleep state (also referred to as "a power management state") or an operational state. For example, the sleep control signal having a first voltage (e.g., 0V) may cause the one or more components (e.g., bit line controller 112 and the word line controller 114) of the memory controller 105 to enter the operational state. For example, the sleep control signal having a second voltage (e.g., 1V) may cause one or more components (e.g., bit line controller 112 and the word line controller 114) of the memory controller 105 to enter the sleep state. In the sleep state, the memory cells 125 and the one or more components of the memory controller 105 may be powered off or may consume lower power than in the operational state. In the operational state, the memory cells 125 and the one or more components of the memory controller 105 may be fully operational to support reading data or writing data and may consume more power than in the sleep state.

The wake-up detection circuit 185 is a circuit that generates a wake-up complete signal indicating whether the wake up sequence is complete. In one aspect, the wake-up detection circuit 185 may receive a sleep tracking signal. The sleep tracking signal may be a signal tracking a status of the group of memory cells 125. For example, the sleep tracking signal may indicate whether the group of memory cells 125 is in the sleep state or in the operational state. Based on the sleep tracking signal, the wake-up detection circuit 185 may determine whether a wake-up sequence is complete or not, and generate the wake-up complete signal, accordingly. According to the wake-up complete signal, the memory device 100 may perform various operations. For example, in response to the wake-up complete signal indicating that the memory cells 125 have not completed the wake-up sequence, the memory device 100 may not perform a read or write operation. For example, in response to the wake-up complete signal indicating that the memory cells 125 have completed the wake-up sequence, the memory device 100 may perform a read or write operation. Detailed description on implementation and operation of the wake-up detection circuit 185 is provided below with respect to FIGS. 2-11.

Figure 2:
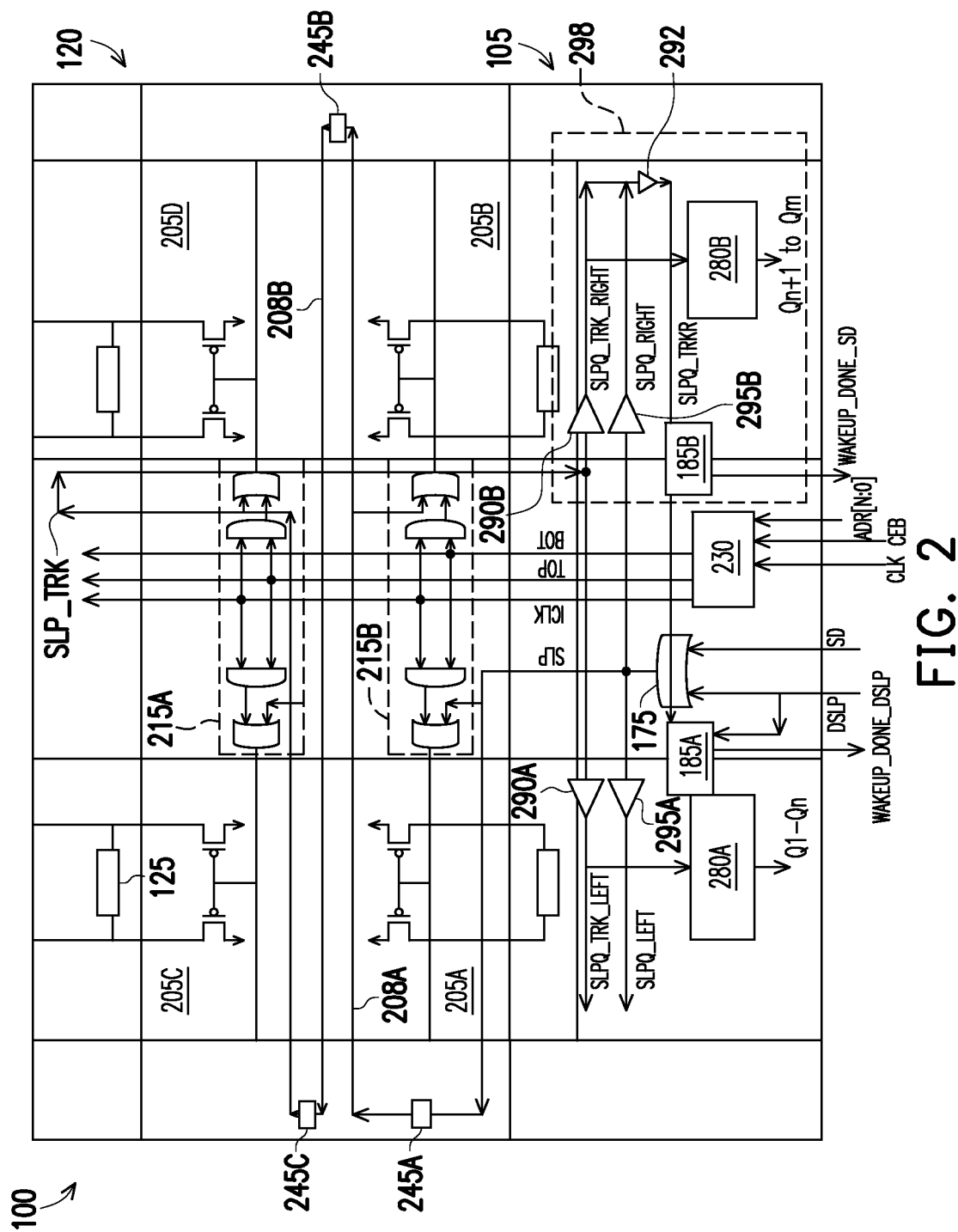
FIG. 2 illustrates a schematic block diagram of an example memory device including circuitries for performing a wake-up sequence, in accordance with some embodiments.

FIG. 2 illustrates a schematic block diagram of an example memory device 100 including circuitries for performing a wake-up sequence, in accordance with some embodiments. In some embodiments, the memory device 100 includes the memory controller 105 disposed below the memory array 120.

In some embodiments, the memory array 120 may be divided into regions, and each region can be configured separately or independently. In one example, the memory array 120 may be divided into a top region and a bottom region. The memory array 120 may include an interface circuit 215A that receives a top control signal TOP and a clock signal ICLK from the memory controller 105 and operates the memory cells 125 in the top region of the memory array 120 according to the top control signal TOP and the clock signal ICLK. The memory array 120 may include an interface circuit 215B that receives a bottom control signal BOT and the clock signal ICLK from the memory controller 105 and operates the memory cells 125 in the bottom region of the memory array 120 according to the bottom control signal BOT and the clock signal ICLK.

In one aspect, the interface circuits 215A, 215B receive a sleep control signal SLP or a delayed signal of the sleep control signal SLP from the memory controller 105 and cause the memory cells 125 to change the state according to the sleep control signal SLP. The sleep control signal may be a signal causing the memory cells 125 to enter the sleep state or the operational state. For example, the memory array 120 includes buffer circuits 245A . . . 245C that propagate a sleep control signal SLP. The buffer circuits 245A . . . 245C may be connected in cascade to propagate the sleep control signal SLP. Each buffer circuit 245 may delay a sleep control signal or a delayed sleep control signal, such that a corresponding region of memory cells can be individually or separately controlled. Rather than simultaneously configuring a state of a large set of memory cells, configuring a state of subsets or regions of memory cells according to delayed control signals can help prevent a large amount of current through the set of memory cells in a short time period to protect the memory cells. In one configuration, the interface circuit 215B receives the sleep control signal SLP and causes memory cells 125 in a left portion 205A of the bottom region to enter the sleep state or the operational state according to the sleep control signal SLP. The buffer circuit 245A may delay the sleep control signal SLP to obtain a first delayed signal 208A. The interface circuit 215B may receive the first delayed signal 208A, and cause memory cells 125 in a right portion 205B of the bottom region to enter the sleep state or the operational state according to the first delayed signal 208A. The buffer circuit 245B may delay the first delayed signal 208A to obtain a second delayed signal 208B. The interface circuit 215A may receive the second delayed signal 208B, and cause memory cells 125 in a left portion 205C of the top region to enter the sleep state or the operational state according to the second delayed signal 208B. The buffer circuit 245C may delay the second delayed signal 208B to obtain a sleep tracking signal SLP TRK. The interface circuit 215A may receive the sleep tracking signal SLP TRK, and cause memory cells 125 in a right portion 205D of the top region to enter the sleep state or the operational state according to the sleep tracking signal SLP TRK. In one aspect, the sleep tracking signal SLP TRK is a last delayed signal of the sleep control signal SLP propagated through the buffer circuits 245A . . . 245C. Although three buffer circuits 245A . . . 245C are shown in FIG. 2, the memory device 100 may include a different number of buffer circuits 245.

In some embodiments, the memory controller 105 includes the sleep control circuit 175, the wake-up detection circuits 185A, 185B, a decoder 230, output drivers 280A, 280B, and delay circuits 290A, 290B, 295A, 295B, 292. These components may operate together to configure the status of the memory array 120, and generate a signal reporting the status of the memory array 120. In some embodiments, the memory controller 105 includes more, fewer, or different components than shown in FIG. 2.

In some embodiments, the decoder 230 is a component that receives a clock signal CLK, an enable signal CEB, and an address signal ADR[N:0], for example, from a host device or a processing device, and generates the clock signal ICLK, the top control signal TOP, and the bottom control signal BOT, accordingly. In some embodiments, the decoder 230 can be replaced by a different component that can perform the functionalities of the decoder 230 disclosed herein. For example, the decoder 230 may generate the clock signal ICLK having pulses of the clock signal CLK, in response to the enable signal CEB enabling the clock signal ICLK to be provided to the top region or the bottom region. The decoder 230 may select the top region or the bottom region, according to the address signal ADR[N:0] and generate the top control signal TOP or the bottom control signal BOT, accordingly. For example, in response to the address signal ADR[N:0] indicating a top region of the memory cells, the decoder 230 may generate the top control signal TOP to enable providing the clock signal ICLK to the top region of the memory cells. For example, in response to the address signal ADR[N:0] indicating a bottom region of the memory cells, the decoder 230 may generate the bottom control signal BOT to enable providing the clock signal ICLK to the bottom region of the memory cells.

In some embodiments, the sleep control circuit 175 receives a signal DSLP and a signal SD, and generates the sleep control signal SLP according to the signal DSLP and the signal SD. The signals DSLP, SD may be signals to configure the memory device 100 in the sleep state or the operational state. The signal DSLP may be provided from a first device (e.g., processor or external host device), where the signal SD may be provided from a second device (e.g., control device or internal device). The sleep control circuit 175 may be embodied as an OR gate. The sleep control circuit 175 may perform an OR operation on the signal DSLP and the signal SD to generate the sleep control signal SLP. For example, the sleep control circuit 175 may generate the sleep control signal SLP having a high voltage (e.g., 1V), in response to either one of the signal DSLP or the signal SD having a high voltage (e.g., 1V). For example, the sleep control circuit 175 may generate the sleep control signal SLP having a low voltage (e.g., 0V), in response to both the signal DSLP and the signal SD having a low voltage (e.g., 0V). In some embodiments, the sleep control circuit 175 can be replaced by a different component that can perform the functionalities of the sleep control circuit 175 disclosed herein.

In some embodiments, the delay circuits 290A, 290B, 292 are circuits to delay the sleep tracking signal SLP TRK. Each of the delay circuits 290A, 290B, 292 may include an even number of inverter circuits, one or more amplifier circuits, one or more buffer circuits, one or more resistive delay circuits, adjustable delay circuits, or any delay circuits. The delay circuit 290A may delay the sleep tracking signal SLP TRK to obtain a delayed signal SLPQ_TRK_LEFT and provide the delayed signal SLPQ_TRK_LEFT to the output drivers 280A. The delay circuit 290A may operate as a buffer between the buffer circuit 245C and the output drivers 280A to reduce a capacitive load at the output of the buffer circuit 245C. Similarly, the delay circuit 290B may delay the sleep tracking signal SLP TRK to obtain a delayed signal SLPQ_TRK_RIGHT and provide the delayed signal SLPQ_TRK_RIGHT to the output drivers 280B. The delay circuit 290B may operate as a buffer between the buffer circuit 245C and the output drivers 280B to reduce a capacitive load at the output of the buffer circuit 245C. In some embodiments, the delay circuit 292 receives the delayed signal SLPQ_TRK_RIGHT and delay the signal SLPQ_TRK_RIGHT to obtain a delayed signal SLPQ_TRKR. The delay circuit 292 may provide the delayed signal SLPQ_TRKR to the wake-up detection circuits 185A, 185B. In some embodiments, the delay circuit 292 may receive the delayed signal SLPQ_TRK_LEFT instead of the delayed signal SLPQ_TRK_RIGHT and delay the delayed signal SLPQ_TRK_LEFT to obtain the delayed signal SLPQ_TRKR.

In some embodiments, the delay circuits 295A, 295B are circuits to delay the sleep control signal SLP. The delay circuit 295A may delay the sleep control signal SLP to obtain a delayed signal SLPQ_LEFT and provide the delayed signal SLPQ_LEFT to the output drivers 280A. The delay circuit 295A may operate as a buffer between the sleep control circuit 175 and the output drivers 280A to reduce a capacitive load at the output of the sleep control circuit 175. Similarly, the delay circuit 295B may delay the sleep control signal SLP to obtain a delayed signal SLPQ_RIGHT and provide the delayed signal SLPQ_RIGHT to the output drivers 280B. The delay circuit 295B may operate as a buffer between the sleep control circuit 175 and the output drivers 280B to reduce a capacitive load at the output of the sleep control circuit 175.

In some embodiments, the output drivers 280A, 280B are circuits to provide data stored by a set of memory cells 125. In one aspect, the output drivers 280A are coupled to one or more sense amplifiers that amplify signals corresponding to data stored by memory cells 125 in a left region. In one aspect, the output drivers 280B are coupled to one or more sense amplifiers that amplify signals corresponding to data stored by memory cells 125 in a right region. The output drivers 280A may receive the delayed signal SLPQ_TRK_LEFT, the delayed signal SLPQ_LEFT, and amplified signals from sense amplifiers corresponding to memory cells 125 in the left region and generate output data signals Q1 . . . Qn corresponding to data stored by the memory cells 125 in the left region, accordingly. For example, in response to the delayed signal SLPQ_TRK_LEFT indicating that the memory cells 125 are in the sleep state or the delayed signal SLPQ_LEFT causing the output drivers 280A to be configured in the sleep state, the output drivers 280A may generate the output data signals Q1 . . . Qn having a predetermined voltage (e.g., 0V corresponding to a bit '0'). For example, in response to the delayed signal SLPQ_TRK_LEFT indicating that the memory cells 125 are in the operational state and the delayed signal SLPQ_LEFT causing the output drivers 280A to be configured in the operational state, the output drivers 280A may generate the output data signals Q1 . . . Qn indicating the stored data, according to the amplified signals from the sense amplifiers. The output drivers 280B may operate in a similar manner as the output drivers 280A with respect to the delayed signal SLPQ_TRK_RIGHT, the delayed signal SLPQ_RIGHT, and amplified signals from sense amplifiers corresponding to memory cells 125 in the right region and generate output data signals Qn+1 . . . Qm corresponding to data stored by the memory cells 125 in the right region, accordingly. Detailed description on configuration and operation of the output drivers 280A, 280B is provided below with respect to FIGS. 3 and 4.

In some embodiments, the wake-up detection circuits 185A, 185B are circuits that generate wake up complete signals WAKEUP_DONE_SD, WAKEUP_DONE_DSLP (also referred to as "WAKEUP_DONE"). A wake-up complete signal WAKEUP_DONE may indicate whether the wake up sequence is complete or not. In one aspect, the wake-up detection circuits 185A, 185B receive the delayed signal SLPQ_TRK_RIGHT or the delayed signal SLPQ_TRK_LEFT, and generate the wake up complete signals WAKEUP_DONE, accordingly. For example, in response to the delayed signal SLPQ_TRK_RIGHT or the delayed signal SLPQ_TRK_LEFT indicating that the memory cells 125 are operating in the sleep state, the wake-up detection circuits 185A, 185B may generate the wake-up complete signals WAKEUP_DONE having a first voltage (e.g., 1V) to indicate that the wake up sequence is incomplete. For example, in response to the delayed signal SLPQ_TRK_RIGHT or the delayed signal SLPQ_TRK_LEFT indicating that the memory cells 125 are operating in the operational state, the wake-up detection circuits 185A, 185B may generate the wake up complete signals WAKEUP_DONE having a second voltage (e.g., 0V) to indicate that the wake up sequence is complete. Detailed description on configuration and operation of wake-up detection circuits 185A, 185B is provided below with respect to FIGS. 3-8, 10 and 11.

Figure 3:
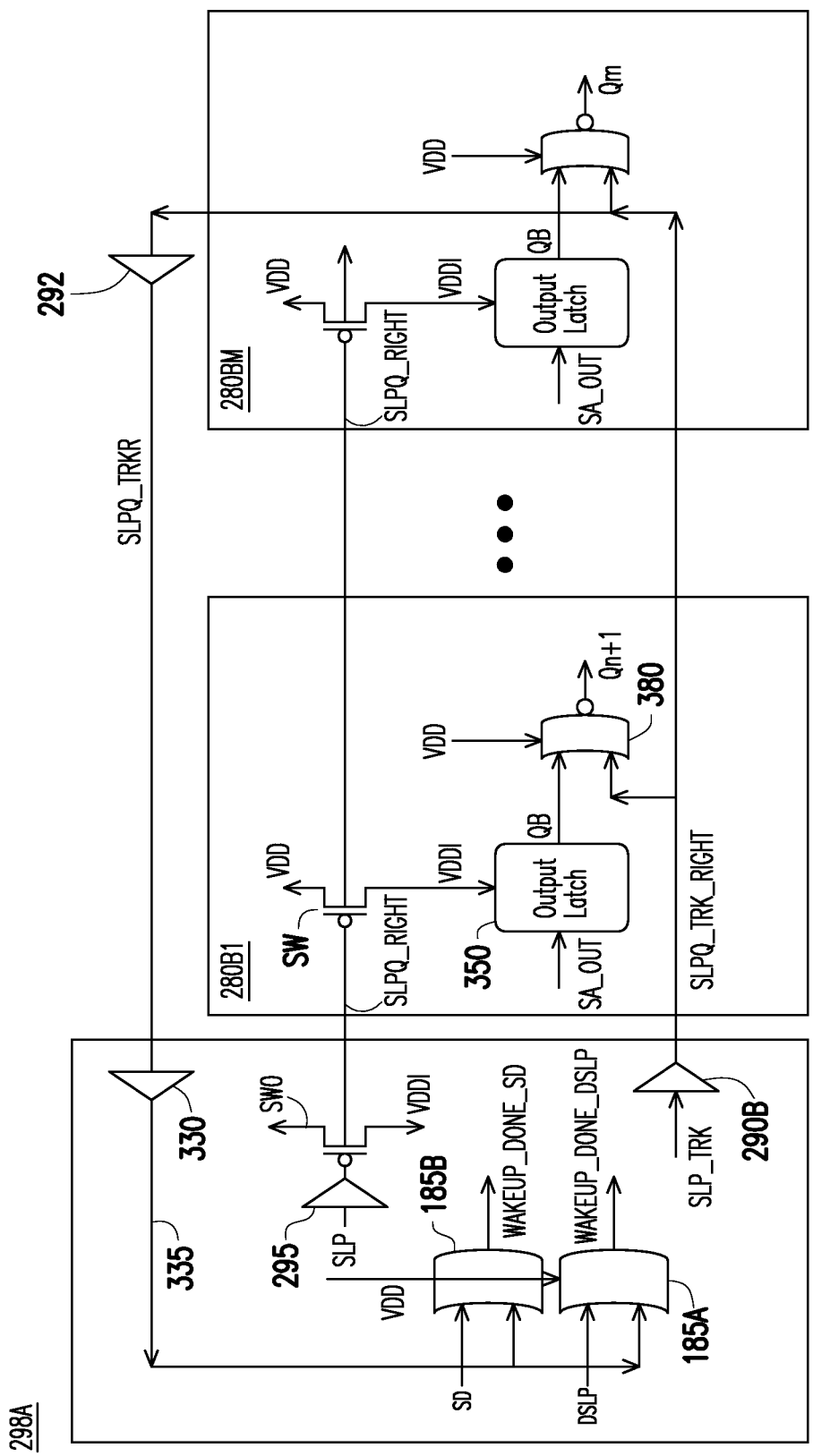
FIG. 3 illustrates a schematic diagram of a portion of the memory controller in FIG. 2, in accordance with some embodiments.

FIG. 3 illustrates a schematic diagram of a portion 298A of the memory controller 105 in FIG. 2, in accordance with some embodiments. In one aspect, the portion 298A of the memory controller 105 includes the output drivers 280B1 . . . 280BM, the delay circuits 290B, 292, 295 (e.g., 295B), and the wake-up detection circuits 185A, 185B. In some embodiments, the delay circuit 290B receives the sleep tracking signal SLP TRK and generates a delayed signal SLPQ_TRK_RIGHT. The output drivers 280B1 . . . 280BM may receive the delayed signal SLPQ_TRK_RIGHT and generate output data signals Qn+1 . . . Qm, according to the delayed signal SLPQ_TRK_RIGHT. The delay circuit 292 may receive the delayed signal SLPQ_TRK_RIGHT after the delayed signal SLPQ_TRK_RIGHT is provided to the output driver 280BM and delay the delayed signal SLPQ_TRK_RIGHT to obtain another delayed signal SLPQ_TRKR. The delay circuit 292 may provide the delayed sleep tracking signal SLPQ_TRKR to a delay circuit 330. The delay circuit 292 may operate as a buffer or an amplifier to amplify the delayed signal SLPQ_TRK_RIGHT provided to the output buffers 280B1 . . . 280BM. The delay circuit 330 may receive the delayed signal SLPQ_TRKR and delay the delayed signal SLPQ_TRKR to obtain a delayed signal 335. The delay circuit 330 may operate as a buffer or an amplifier to amplify the delayed sleep tracking signal SLPQ_TRKR provided from the delay circuit 292 through a long metal rail extending along the output buffers 280B1 . . . 280BM. The delay circuit 330 may include an even number of inverter circuits, one or more amplifier circuits, one or more buffer circuits, one or more resistive delay circuits, an adjustable delay circuits, or any delay circuits. The delay circuit 330 may provide the delayed signal 335 to the wake-up detection circuits 185A, 185B.

In some embodiments, the wake-up detection circuit 185A includes or is implemented as an OR gate. The wake-up detection circuit 185A may receive the delayed signal 335 and a signal DSLP, and perform an OR operation on the delayed signal 335 and the signal DSLP to generate the wake up complete signal WAKEUP_DONE_DSLP according to the OR operation.

In some embodiments, the wake-up detection circuit 185B includes or is implemented as an OR gate. The wake-up detection circuit 185B may receive the delayed signal 335 and a signal SD and perform OR operation on the delayed signal 335 and the signal SD to generate the wake up complete signal WAKEUP_DONE_SD according to the OR operation.

In one aspect, each output driver 280 includes a latch circuit 350, a power switch SW, and an output circuit 380. These components may operate together to selectively provide an output data Q, according to the delayed sleep control signal SLPQ_RIGHT, the delayed sleep tracking signal SLPQ_TRK_RIGHT, or both. For example, in response to the delayed signal SLPQ_TRK_RIGHT indicating that the memory cell 125 is in the sleep state or the delayed signal SLPQ_RIGHT causing the latch circuit 350 to be configured in the sleep state, the output drivers 280 may generate the output data signal Q having a predetermined voltage (e.g., 0V corresponding to a bit '0'). For example, in response to the delayed signal SLPQ_TRK_RIGHT indicating that the memory cell 125 is in the operational state and the delayed signal SLPQ_RIGHT causing the latch circuit 350 to be configured in the operational state, the output drivers 280 may generate the output data signal Q indicating the stored data, according to the amplified signal from a sense amplifier coupled to the memory cell 125.

In one configuration, the power switch SW is embodied as a P-type transistor. In some embodiments, the power switch SW can be replaced by a different component that can perform the functionalities of the power switch SW disclosed herein. The power switch SW may include a source electrode coupled to a power rail to receive a supply voltage VDD, a gate electrode coupled to an output of a delay circuit 295, and a drain electrode coupled to a latch circuit 350. In this configuration, the power switch SW may receive the delayed sleep control signal SLPQ_RIGHT and selectively provide an internal supply voltage VDDI corresponding to the supply voltage VDD to the latch circuit 350, according to the delayed sleep control signal SLPQ_RIGHT. For example, the power switch SW can be enabled, in response to the delayed sleep control signal SLPQ_RIGHT having a low voltage (e.g., 0V) to provide the supply voltage VDD to the internal supply voltage VDDI of the latch circuit 350. For example, the power switch SW can be disabled, in response to the delayed sleep control signal SLPQ_RIGHT having a high voltage (e.g., 1V) to not provide the supply voltage VDD to the internal supply voltage VDDI of the latch circuit 350.

The latch circuit 350 receives an amplified signal corresponding to the stored data of a memory cell from a sense amplifier and stores the amplified signal. In some embodiments, the latch circuit 350 can be replaced by a different component that can perform the functionalities of the latch circuit 350 disclosed herein. In one configuration, the latch circuit 350 includes an input coupled to an output of a sense amplifier and an output coupled to a first input of the output circuit 380. In this configuration, when the internal supply voltage VDDI has a sufficient voltage (e.g., larger than 0.7~0.9V), the latch circuit 350 may be enabled, and receive and store the amplified signal QB from the sense amplifier. When the internal supply voltage VDDI does not have the sufficient voltage, the latch circuit 350 may be disabled or may not be operational, and may not store the amplified signal QB from the sense amplifier.

The output circuit 380 is a component that generates the output data Q, according to the stored amplified signal QB from the sense amplifier and the delayed sleep tracking signal SLPQ_TRK_RIGHT. In some embodiments, the output circuit 380 is embodied as a NOR circuit. In some embodiments, the output circuit 380 can be replaced by a different component that can perform the functionalities of the output circuit 380 disclosed herein. In one configuration, the output circuit 380 includes a first input coupled to an output of the latch circuit 350, and a second input coupled to an output of the delay circuit 290B. In this configuration, the output circuit 380 may receive the stored amplified signal QB at the first input and the delayed sleep tracking signal SLPQ_TRK_RIGHT at the second input, and perform an OR operation on the stored amplified signal QB and the delayed sleep tracking signal SLPQ_TRK_RIGHT to generate the output data Q.

In some embodiments, the delay circuit 295 receives the sleep control signal SLP and generates the control signal SLPQ_RIGHT according to the sleep control signal SLP. According to the control signal SLPQ_RIGHT, the output drivers 280B1 . . . 280BM may be enabled or disabled. In one configuration, the memory controller 105 includes a power switch SW0 coupled to an output of the delay circuit 295. In one configuration, the power switch SW0 is embodied as a P-type transistor. The power switch SW0 may be the same type of transistor as the power switches SWs in the output drivers 280. In some embodiments, the power switch SW0 can be replaced by a different component that can perform the functionalities of the power switch SW0 disclosed herein. The power switch SW0 may include a source electrode coupled to a power rail to receive a supply voltage VDD, a gate electrode coupled to the output of a delay circuit 295, and a drain electrode coupled to a power detection circuit (not shown). In this configuration, the drain electrode of the power switch SW0 may have the internal supply voltage VDDI, which can be provided to the power detection circuit to determine the internal supply voltage VDDI provided to the output drivers 280.

Advantageously, the memory device 100 can reduce power consumption when transitioning from the sleep state to the operational state. In one aspect, causing the output circuit 380 to generate the output signal Q having the predetermined voltage (e.g., 0V) in response to the sleep control signal SLP or the control signal SLPQ_RIGHT may cause the output driver 280 to consume power when the memory cell 125 has not sufficiently transitioned from the sleep state to the operational state. By causing the output circuit 380 to generate the output signal Q having the predetermined voltage in response to the sleep tracking signal SLP TRK or the delayed sleep tracking signal SLPQ_TRK_RIGHT, power consumption of the output driver 280 when the memory cell 125 has not sufficiently transitioned from the sleep state to the operational state can be reduced or obviated.

Advantageously, the wake-up detection circuit 185 may generate the wake up complete signal WAKEUP_DONE (e.g., WAKEUP_DONE_SD or WAKEUP_DONE_DSLP) accurately, when the memory cell 125 and the output driver 280 have transitioned from the sleep state to the operational state. In one aspect, the internal supply voltage VDDI provided to the one or more circuits of the output driver 280 may change, in response to the sleep control signal SLP. For example, the internal supply voltage VDDI may be set to a first voltage (e.g., 0V) when the sleep control signal SLP having a second voltage (e.g., 1V) causes the output driver 280 to be in the sleep state. The internal supply voltage VDDI may be set to the second voltage (e.g., 1V) when the sleep control signal SLP having the first voltage (e.g., 0V) causes the output driver 280 to be in the operational state. Due to capacitive loading, the change in the internal supply voltage VDDI may be delayed with respect to the change in the sleep control signal SLP or the control signal SLPQ_RIGHT. By causing the wake-up detection circuit 185 to generate the wake-up complete signal WAKE-UP_DONE based on the delayed signal 335, the wake up complete signal WAKEUP_DONE can be generated accurately when the internal supply voltage VDDI has reached a sufficient voltage for the output driver 280 to be operational. Accordingly, prematurely causing other operations such as reading data stored by the memory cell 125 before the memory cell 125 and the output driver 280 have transitioned from the sleep state to the operational state can be obviated, such that the memory device 100 can operate in a reliable manner with reduced power consumption.

Figure 4:
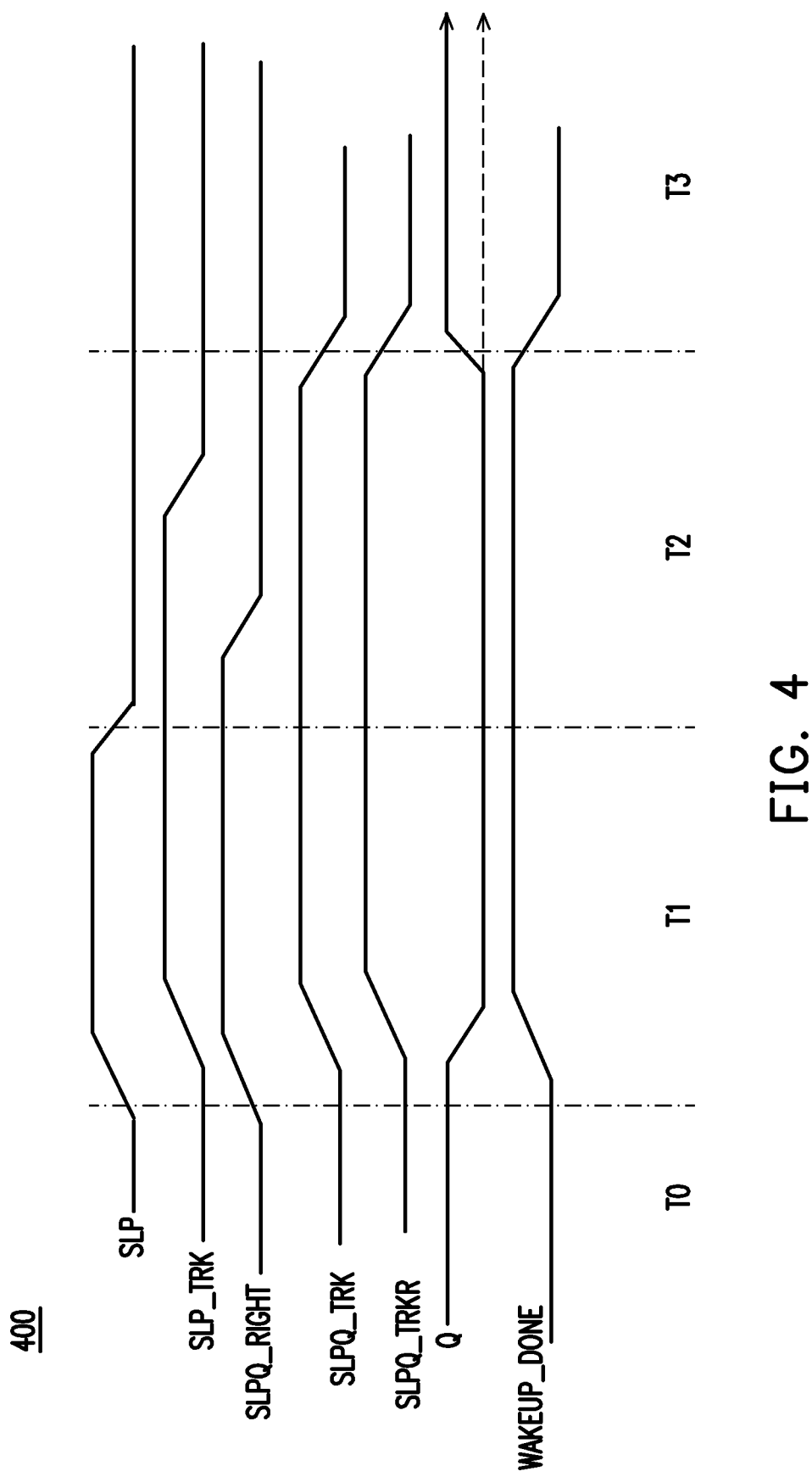
FIG. 4 is a timing diagram showing a wake-up sequence of the memory device, in accordance with some embodiments.

FIG. 4 is a timing diagram 400 showing a wake-up sequence of the memory device 100, in accordance with some embodiments. In one aspect, the memory device 100 operates in an operational state during a time period T0, then enters a sleep state during a time period T1. Then, the memory device 100 enters a transition state (or a wake-up state) during a time period T2, and enters the operational state during the time period T3.

In the time period T0, the sleep control circuit 175 generates the sleep control signal SLP having a low voltage (e.g., 0V) causing the memory cells 125 to operate in the operational state. In the time period T0, the sleep control signal SLP is propagated through the buffer circuits 245A . . . 245C, where each buffer circuit 245 can generate a delayed control signal to configure a corresponding region of memory cells. In the time period T0, the buffer circuit 245C (or last buffer circuit) generates the sleep tracking signal SLP TRK having the low voltage (e.g., 0V) to indicate that the memory cells 125 are in the operational state.

In the time period T0, the delay circuit 290B receives the sleep tracking signal SLP TRK, and generates the delayed sleep tracking signal SLPQ_TRK (or SLPQ_TRK_RIGHT) having the low voltage (e.g., 0V), in response to the sleep tracking signal SLP TRK having the low voltage. The delay circuit 290B may provide the delayed sleep tracking signal SLPQ_TRK (or SLPQ_TRK_RIGHT) to the output circuits 380. The delay circuit 292 may receive the delayed sleep tracking signal SLPQ_TRK (or SLPQ_TRK_RIGHT), and generate the delayed sleep tracking signal SLPQ_TRKR having the low voltage (e.g., 0V) to indicate that the memory cells 125 and the output drivers 280 are in the operational state, in response to the delayed sleep tracking signal SLPQ_TRK (or SLPQ_TRK_RIGHT) having the low voltage. In the time period T0, in response to delayed sleep tracking signal SLPQ_TRKR having the low voltage (e.g., 0V), the wake up detection circuit 185 may generate the wake up complete signal WAKEUP_DONE having the low voltage (e.g., 0V) to indicate that the memory device 100 is operating in the operational state.

In the time period T0, the delay circuit 295B (or 295) receives the sleep control signal SLP, and generates the control signal SLPQ_RIGHT following or delayed from the sleep control signal SLP having the low voltage (e.g., 0V). In the time period T0, in response to the control signal SLPQ_RIGHT having the low voltage (e.g., 0V), the latch circuits 350 may be powered on, and may provide the stored amplified signals QB to the output circuits 380. In the time period T0, the output circuits 380 may generate the output signals Q indicating the data stored by the memory cells 125 according to the stored amplified signals QB, in response to the delayed sleep tracking signal SLPQ_TRK_RIGHT (or SLPQ_TRK) having the low voltage (e.g., 0V). For example, in the time period T0, the output circuits 380 may generate the output signals Q indicating the data stored by the memory cells 125 as an inverse of (or an opposite value of) the stored amplified signals QB, in response to the delayed sleep tracking signal SLPQ_TRK_RIGHT (or SLPQ_TRK) having the low voltage (e.g., 0V).

In the time period T1, the sleep control circuit 175 generates the sleep control signal SLP having a high voltage (e.g., 1V) causing the memory cells 125 to operate in the sleep state. In the time period T0, the sleep control signal SLP is propagated through the buffer circuits 245A ... 245C. In the time period T1, after a certain delay due to the buffer circuits 245A ... 245C, the buffer circuit 245C (or last buffer circuit) generates the sleep tracking signal SLP TRK having the high voltage (e.g., 1V) to indicate that the memory cells 125 are in the sleep state.

In the time period T1, the delay circuit 290B receives the sleep tracking signal SLP TRK, and generates the delayed sleep tracking signal SLPQ_TRK (or SLPQ_TRK_RIGHT) having the high voltage (e.g., 1V), in response to the sleep tracking signal SLP TRK having the high voltage. The delay circuit 290B may provide the delayed sleep tracking signal SLPQ_TRK (or SLPQ_TRK_RIGHT) to the output circuits 380. The delay circuit 292 may receive the delayed sleep tracking signal SLPQ_TRK (or SLPQ_TRK_RIGHT), and generate the delayed sleep tracking signal SLPQ_TRKR having the high voltage (e.g., 1V) to indicate that the memory cells 125 and the output drivers 280 are in the sleep state, in response to the delayed sleep tracking signal SLPQ_TRK (or SLPQ_TRK_RIGHT) having the high voltage. In the time period T1, in response to the delayed sleep tracking signal SLPQ_TRKR having the high voltage (e.g., 1V), the wake-up detection circuit 185 may generate the wake up complete signal WAKEUP_DONE having the high voltage (e.g., 1V) to indicate that the memory device 100 is operating in the sleep state or the wake up sequence has not completed yet.

In the time period T1, the delay circuit 295B (or 295) receives the sleep control signal SLP, and generates the control signal SLPQ_RIGHT following or delayed from the sleep control signal SLP having the high voltage (e.g., 1V). In the time period T1, the latch circuits 350 may be powered off, in response to the control signal SLPQ_RIGHT having the high voltage (e.g., 1V). In addition, in the time period T1, the output circuits 380 may generate the output signal Q having a predetermined voltage (e.g., 0V) irrespective of data stored by the memory cells 125, in response to the delayed sleep tracking signal SLPQ_TRK_RIGHT (or SLPQ_TRK) having the high voltage (e.g., 1V).

In the time period T2, the sleep control circuit 175 generates the sleep control signal SLP having a low voltage (e.g., 0V) to initiate a wake-up sequence. The sleep control signal SLP transitioning from the high voltage (e.g., 1V) to a low voltage (e.g., 0V) may cause the memory cells 125 to transition from the sleep state to the operational state. In the time period T2, the sleep control signal SLP is propagated through the buffer circuits 245A ... 245C, where each buffer circuit 245 can generate a delayed control signal to configure a corresponding region of memory cells. The sleep tracking signal SLP TRK may be delayed with respect to the sleep control signal SLP, because of the delay associated with the buffer circuits 245A ... 245C. In the time period T2, the buffer circuit 245C (or last buffer circuit) generates the sleep tracking signal SLP TRK having the low voltage (e.g., 0V) after a certain delay (e.g., delay associated with the buffer circuits 245A ... 245C) from the sleep control signal SLP transitioning to the low voltage (e.g., 0V).

In the time period T2, the delay circuit 290B receives the sleep tracking signal SLP TRK, and generates the delayed sleep tracking signal SLPQ_TRK (or SLPQ_TRK_RIGHT), according to the sleep tracking signal SLP TRK. In the time period T2, the delayed sleep tracking signal SLPQ_TRK (or SLPQ_TRK_RIGHT) may still have the high voltage (e.g., 1V), due to delay associated with the delay circuit 290B. In the time period T2, the delay circuit 290B may provide the delayed sleep tracking signal SLPQ_TRK (or SLPQ_TRK_RIGHT) to the output circuits 380. In the time period T2, the delay circuit 292 may receive the delayed sleep tracking signal SLPQ_TRK (or SLPQ_TRK_RIGHT), and generate the delayed sleep tracking signal SLPQ_TRKR following or delayed from the sleep tracking signal SLP TRK or the delayed sleep tracking signal SLPQ_TRK (or SLPQ_TRK_RIGHT) having the high voltage (e.g., 1V) to indicate that the wake up sequence has not completed yet. In the time period T2, the delayed sleep tracking signal SLPQ_TRKR may still have the high voltage (e.g., 1V), due to delay associated with the delay circuit 292. In the time period T2, in response to the delayed sleep tracking signal SLPQ_TRKR having the high voltage (e.g., 1V), the wake-up detection circuit 185 may generate the wake up complete signal WAKEUP_DONE having the high voltage (e.g., 1V) to indicate that the memory device 100 is still operating in the sleep state or the wake up sequence has not completed yet.

In the time period T2, the delay circuit 295B (or 295) receives the sleep control signal SLP, and generates the control signal SLPQ_RIGHT following or delayed from the sleep control signal SLP having the low voltage (e.g., 0V) after a certain delay (e.g., delay associated with the delay circuit 295). In the time period T2, in response to the control signal SLPQ_RIGHT having the low voltage (e.g., 0V), the latch circuits 350 may be powered on. In the time period T2, the latch circuits 350 may receive amplified signals corresponding to data stored by the memory cells 125 and store the amplified signals QB. However, in the time period T2, the output circuits 380 may maintain the output signal Q having the predetermined voltage (e.g., 0V) irrespective of data stored by the memory cells 125, in response to the delayed sleep tracking signal SLPQ_TRK_RIGHT (or SLPQ_TRK) having the high voltage (e.g., 1V).

In the time period T3, the sleep control signal SLP has the low voltage (e.g., 0V). In the time period T3, the sleep tracking signal SLP TRK may have the low voltage (e.g., 0V). In the time period T3, the control signal SLPQ_RIGHT may also have the low voltage (e.g., 0V). In the time period T3, the delayed sleep tracking signal SLPQ_TRK_RIGHT (or SLPQ_TRK) following or delayed from the sleep tracking signal SLP TRK may have the low voltage (e.g., 0V). In the time period T3, the latch circuits 350 may be still powered on, in response to the control signal SLPQ_RIGHT having the low voltage (e.g., 0V), and may provide the stored amplified signals QB to the output circuits 380. In the time period T3, the output circuits 380 may generate the output signal Q indicating the data stored by the memory cells 125 according to the stored amplified signals QB, in response to the delayed sleep tracking signal SLPQ_TRK_RIGHT (or SLPQ_TRK) having the low voltage (e.g., 0V). In the time period T3, in response to the delayed sleep tracking signal SLPQ_TRK_RIGHT (or SLPQ_TRK) having the low voltage (e.g., 0V), the delay circuit 292 may generate the delayed sleep tracking signal SLPQ_TRKR having the low voltage (e.g., 0V). For example, in the time period T3, the output circuits 380 may generate the output signals Q indicating the data stored by the memory cells 125 as an inverse of (or an opposite value of) the stored amplified signals QB, in response to the delayed sleep tracking signal SLPQ_TRK_RIGHT (or SLPQ_TRK) having the low voltage (e.g., 0V). In the time period T3, in response to the delayed sleep tracking signal SLPQ_TRKR having the low voltage (e.g., 0V), the wake-up detection circuit 185 may generate the wake up complete signal WAKEUP_DONE having the low voltage (e.g., 0V) to indicate that the memory device 100 is operating in the operational state or the wake up sequence has completed.

Advantageously, the memory device 100 can reduce power consumption in the wake-up state or when transitioning from the sleep state to the operational state. In one aspect, causing the output circuit 380 to generate the output signal Q having the predetermined voltage (e.g., 0V) in response to the sleep control signal SLP or the control signal SLPQ_RIGHT may cause the output driver 280 to consume power when the memory cell 125 has not sufficiently transitioned from the sleep state to the operational state. By causing the output circuit 380 to generate the output signal Q having the predetermined voltage in response to the sleep tracking signal SLP TRK or the delayed sleep tracking signal SLPQ_TRK_RIGHT, power consumption of the output driver 280 when the memory cell 125 has not sufficiently transitioned from the sleep state to the operational state can be reduced or obviated.

Figure 5:
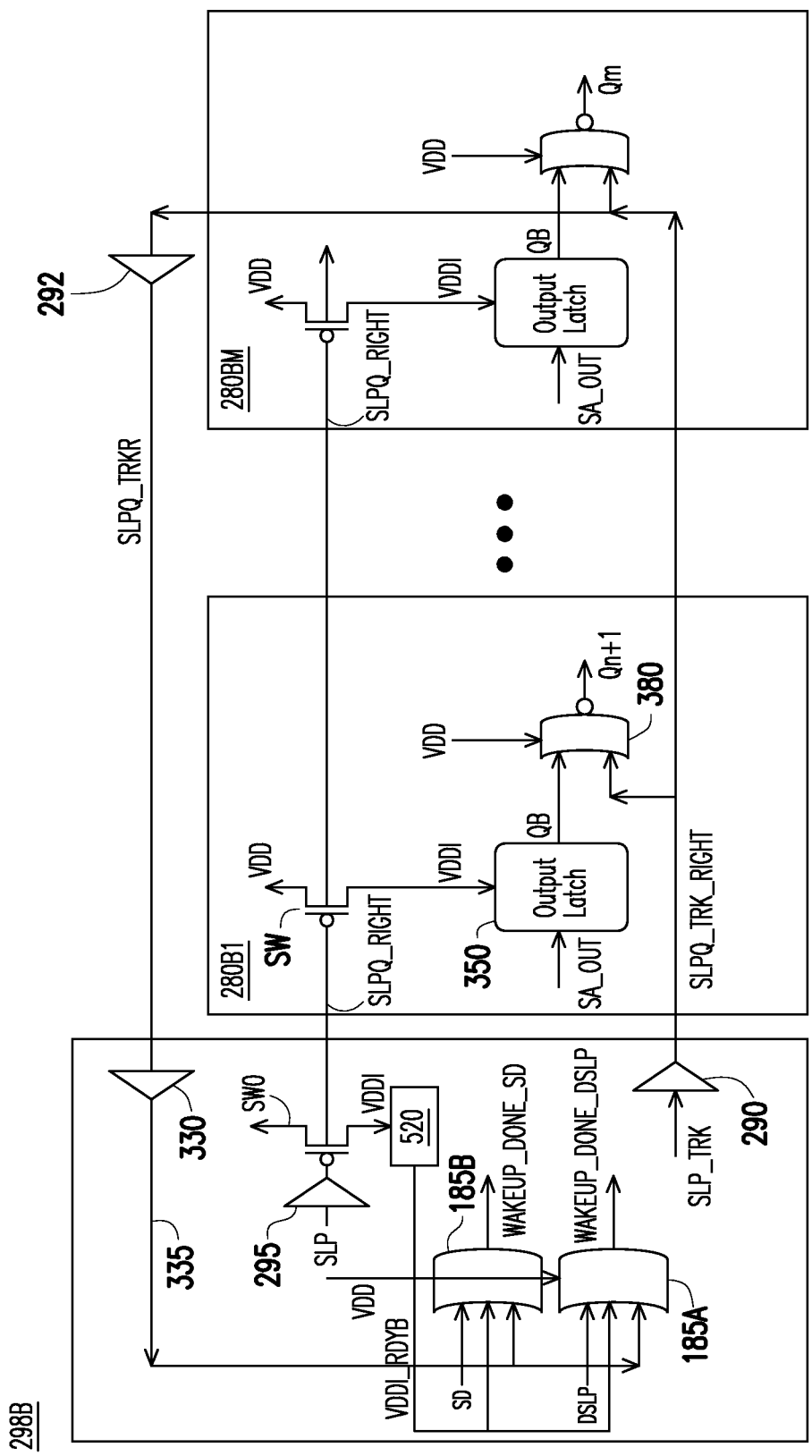
FIG. 5 illustrates a schematic diagram of a portion of the memory controller in FIG. 2, in accordance with some embodiments.

FIG. 5 illustrates a schematic diagram of a portion 298B of the memory controller 105 in FIG. 2, in accordance with some embodiments. In one aspect, the portion 298B of the memory controller 105 is similar to the portion 298A of the memory controller 105 in FIG. 3, except the memory controller 105 includes a power detection circuit 520 coupled to the drain electrode of the power switch SW0, and the wake-up detection circuits 185A, 185B. Thus, detailed description on duplicated portion thereof is omitted herein for the sake of brevity.

In some embodiments, the power detection circuit 520 includes an input coupled to the drain electrode of the power transistor SW0, and an output coupled to inputs of the wake-up detection circuits 185A, 185B. In this configuration, the power detection circuit 520 may receive the internal supply voltage VDDI from the power transistor SW0 and generate a power detection signal VDDI_RDYB according to the internal supply voltage VDDI. For example, if the internal supply voltage VDDI is higher than a threshold voltage (e.g., 0.7~0.9V), the power detection circuit 520 may generate the power detection signal VDDI_RDYB having a low voltage (e.g., 0V) to indicate that the output drivers 280 have sufficient power or internal supply voltage VDDI to be operational. For example, if the internal supply voltage VDDI is less than the threshold voltage (e.g., 0.7~0.9V), the power detection circuit 520 may generate the power detection signal VDDI_RDYB having a high voltage (e.g., 1V) to indicate that the output drivers 280 do not have sufficient power or internal supply voltage VDDI to be operational.

The wake-up detection circuits 185A, 185B may generate the wake-up complete signals WAKEUP_DONE_SD, WAKEUP_DONE_DSLP, further based on the power detection signal VDDI_RDYB. For example, the wake-up detection circuit 185A may be implemented as a three input OR gate, and perform an OR operation on an input signal DSLP, the power detection signal VDDI_RDYB, and the delayed signal 335 to generate the wake-up complete signals WAKEUP_DONE_DSLP according to the OR operation. Similarly, for example, the wake-up detection circuit 185B may be implemented as a three input OR gate, and perform an OR operation on an input signal SD, the power detection signal VDDI_RDYB, and the delayed signal 335 to generate the wake up complete signals WAKEUP_DONE_SD according to the OR operation.

Advantageously, the wake-up detection circuit 185 may generate the wake up complete signal WAKEUP_DONE accurately, when the memory cell 125 and the output driver 280 have transitioned from the sleep state to the operational state. In one aspect, the internal supply voltage VDDI provided to the one or more circuits of the output driver 280 may change, in response to the sleep control signal SLP. For example, the internal supply voltage VDDI may be set to a first voltage (e.g., 0V) when the sleep control signal SLP has a high voltage (e.g., 1V) causing the output driver 280 to be in the sleep state. The internal supply voltage VDDI may be set to a second voltage (e.g., 1V) when the sleep control signal SLP has a low voltage (e.g., 0V) causing the output driver 280 to be in the operational state. Due to capacitive loading, the change in the internal supply voltage VDDI may be delayed with respect to the change in the sleep control signal SLP or the control signal SLPQ_RIGHT. By causing the wake-up detection circuit 185 to generate the wake up complete signal WAKEUP_DONE based on the delayed signal 335 and the power detection signal VDDI_RDYB, the wake up complete signal WAKEUP_DONE can be generated accurately when the internal supply voltage VDDI has reached a sufficient voltage for the output driver 280 to be operational. Accordingly, prematurely causing other operations such as reading data stored by the memory cell 125 before the memory cell 125 and the output driver 280 have sufficiently transitioned from the sleep state to the operational state can be obviated, such that the memory device 100 can operate in a reliable manner with reduced power consumption.

Figure 6:
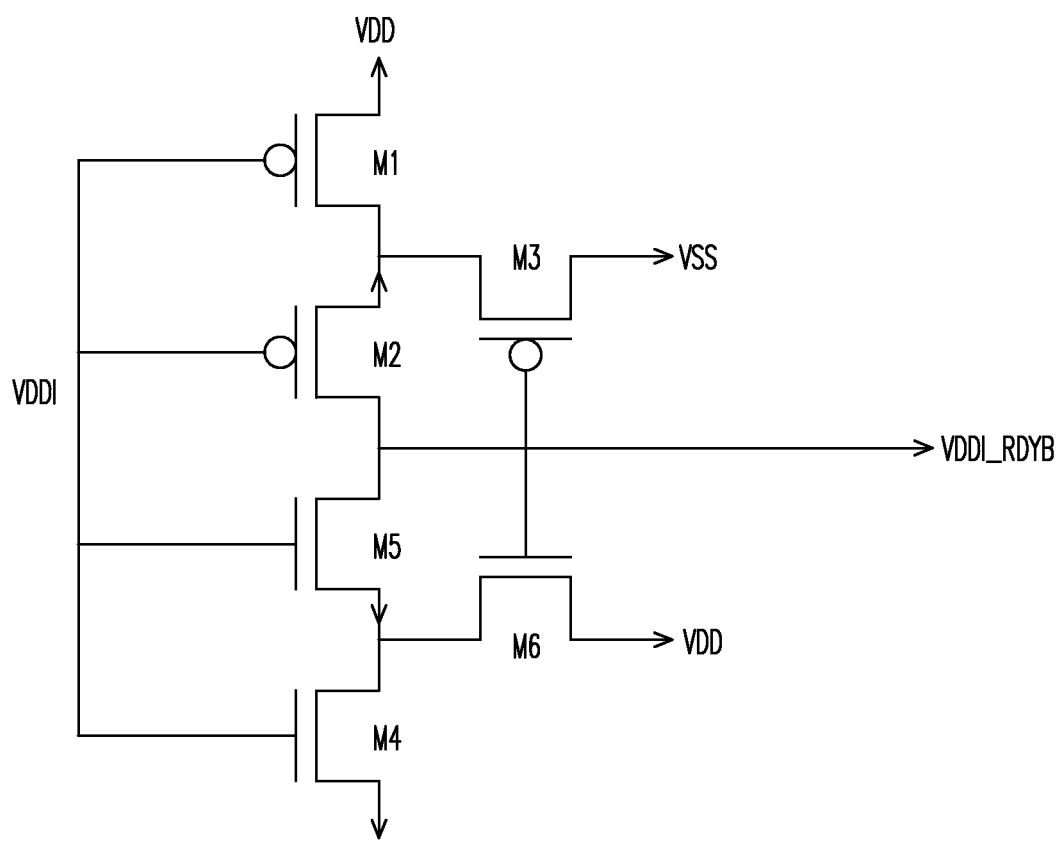
FIG. 6 illustrates a schematic diagram of a power detection circuit, in accordance with some embodiments.

FIG. 6 illustrates a schematic diagram of the power detection circuit 520, in accordance with some embodiments. In some embodiments, the power detection circuit 520 includes transistors M1 . . . M6. The transistors M1 . . . M3 are embodied as P-type transistors, and the transistors M4 . . . M6 are embodied as N-type transistors. These components may operate together to detect an internal supply voltage VDDI and generate the power detection signal VDDI_RDYB according to the internal supply voltage VDDI. For example, if the internal supply voltage VDDI is higher than a threshold voltage (e.g., 0.7~0.9V), the power detection circuit 520 may generate the power detection signal VDDI_RDYB having a low voltage (e.g., 0V) to indicate that the output drivers 280 have sufficient power or internal supply voltage VDDI to be operational. For example, if the internal supply voltage VDDI is less than the threshold voltage (e.g., 0.7~0.9V), the power detection circuit 520 may generate the power detection signal VDDI_RDYB having a high voltage (e.g., 1V) to indicate that the output drivers 280 do not have sufficient power or internal supply voltage VDDI to be operational. In some embodiments, the power detection circuit 520 includes more, fewer, or different components than shown in FIG. 6.

In one configuration, the transistor M1 includes a source electrode coupled to a power rail to receive a supply voltage VDD, and a gate electrode coupled to an input of the power detection circuit 520. In one configuration, a drain electrode of the transistor M1 is coupled to a source electrode of the transistor M2 and a source electrode of the transistor M3. In one configuration, the transistor M2 includes a gate electrode coupled to the input of the power detection circuit 520, and a drain electrode coupled to an output of the power detection circuit 520. In one configuration, the transistor M3 includes a gate electrode coupled to the output of the power detection circuit 520, and a drain electrode coupled to a ground rail to receive a ground voltage VSS.

In one configuration, the transistor M4 includes a source electrode coupled to the ground rail to receive the ground voltage VSS, and a gate electrode coupled to the input of the power detection circuit 520. In one configuration, a drain electrode of the transistor M4 is coupled to a source electrode of the transistor M5 and a source electrode of the transistor M6. In one configuration, the transistor M5 includes a gate electrode coupled to the input of the power detection circuit 520, and a drain electrode coupled to the output of the power detection circuit 520. In one configuration, the transistor M6 includes a gate electrode coupled to the output of the power detection circuit 520, and a drain electrode coupled to the power rail to receive the supply voltage VDD.

In this configuration, the transistors M1 ... M6 may be arranged as a Schmitt trigger, and generate the power detection signal VDDI_RDYB according to the internal supply voltage VDDI. For example, if the internal supply voltage VDDI is higher than a threshold voltage (e.g., 0.7~0.9V), the transistors M4, M5 may be enabled and the transistors M1, M2 may be disabled to pull down a voltage at the output of the power detection circuit 520. By pulling down the voltage at the output of the power detection circuit 520, the power detection signal VDDI_RDYB at the output of the power detection circuit 520 may have a low voltage (e.g., 0V) to indicate that the output drivers 280 have sufficient power or internal supply voltage VDDI to be operational. For example, if the internal supply voltage VDDI is less than the threshold voltage (e.g., 0.7~0.9V), the transistors M4, M5 may be disabled and the transistors M1, M2 may be enabled to pull up the voltage at the output of the power detection circuit 520. By pulling up the voltage at the output of the power detection circuit 520, the power detection signal VDDI_RDYB at the output of the power detection circuit 520 may have a high voltage (e.g., 1V) to indicate that the output drivers 280 do not have sufficient power or internal supply voltage VDDI to be operational.

Figure 7:
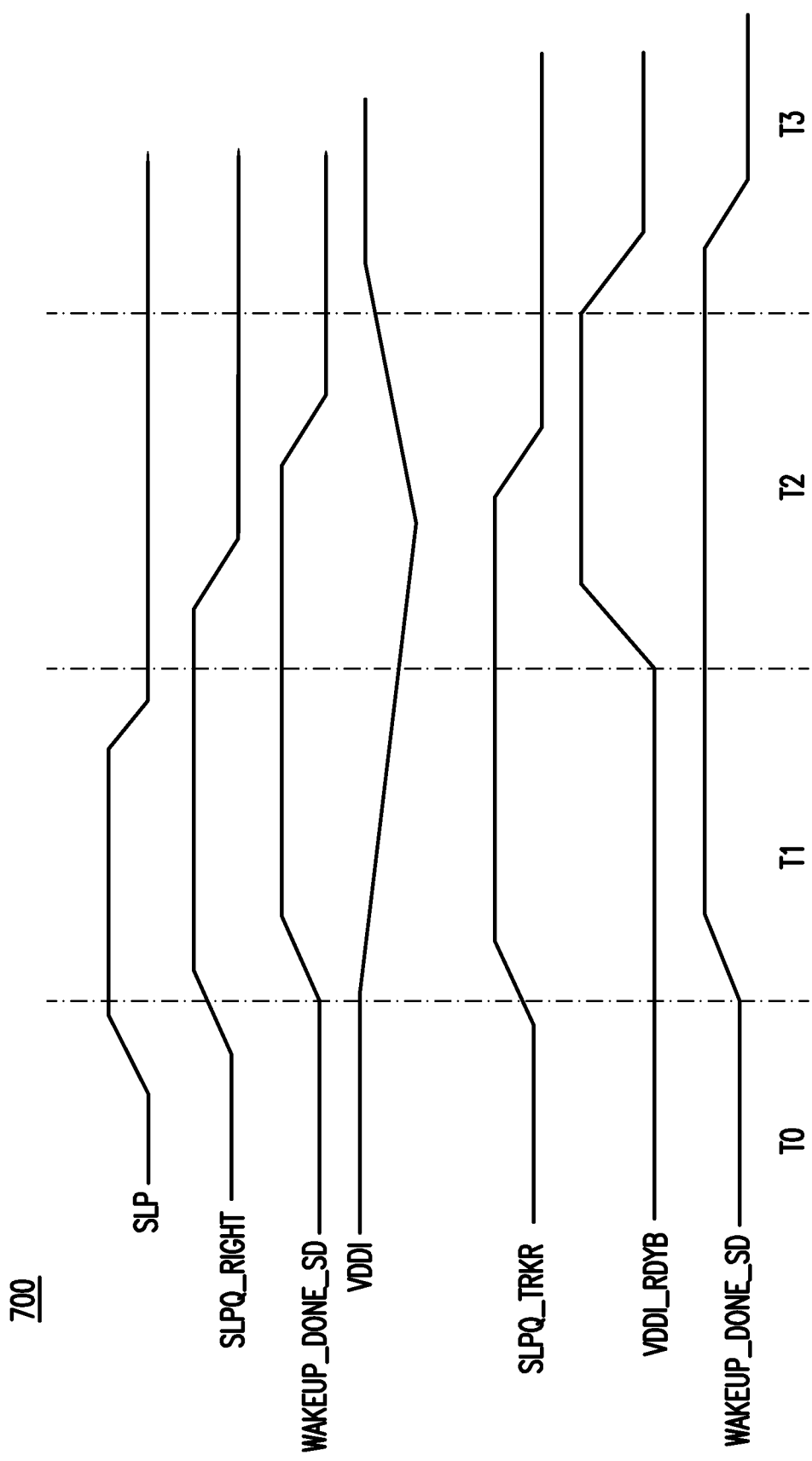
FIG. 7 is a timing diagram showing a wake-up sequence of the memory device, in accordance with some embodiments.

FIG. 7 is a timing diagram 700 showing a wake-up sequence of the memory device 100, in accordance with some embodiments. In one aspect, the signals SLP, SLPQ_RIGHT, WAKE DONE, and SLPQ_TRKR are similar to the ones as described in FIG. 4. Thus, detailed description of duplicated portion thereof is omitted herein for the sake of brevity.

In the time period T0, the delay circuit 295 generates the delayed signal SLPQ_RIGHT having a low voltage (e.g., 0V), in response to the sleep control signal SLP having a low voltage (e.g., 0V). In response to the delayed signal SLPQ_RIGHT having the low voltage, the power switch SW can be enabled. By enabling the power switch SW, the internal supply voltage VDDI may have a high voltage (e.g., 1V) to enable the latch circuit 350 of the output driver 280. In the time period T0, the power detection circuit 520 may detect that the supply voltage VDDI is higher than the threshold voltage and generate the power detection signal VDDI_RDYB having a low voltage (e.g., 0V) to indicate that the output drivers 280 have sufficient power or internal supply voltage VDDI to be operational. In the time period T0, in response to the delayed sleep tracking signal SLPQ_TRKR (or SLPQ_TRK_RIGHT) having the low voltage (e.g., 0V) and the power detection signal VDDI_RDYB having the low voltage (e.g., 0V), the wake-up detection circuit 185 may generate the wake up complete signal WAKEUP_DONE having the low voltage (e.g., 0V) to indicate that the memory device 100 is operating in the operational state.

In the time period T1, the delay circuit 295 generates the delayed signal SLPQ_RIGHT having a high voltage (e.g., 1V), in response to the sleep control signal SLP having a high voltage (e.g., 1V). In response to the SLPQ_RIGHT having the high voltage (e.g., 1V), the power switch SW can be disabled. By disabling the power switch SW, the internal supply voltage VDDI may decrease towards a low voltage (e.g., 0V) to disable the latch circuit 350 of the output driver 280. Because of capacitive loads of the output drivers 280, the internal supply voltage VDDI may not change or drop immediately. In the time period T1, the power detection circuit 520 may detect that the supply voltage VDDI is still higher than the threshold voltage and generate or maintain the power detection signal VDDI_RDYB having the low voltage (e.g., 0V) to indicate that the output drivers 280 have sufficient power or internal supply voltage VDDI to be operational. In the time period T1, in response to the delayed sleep tracking signal SLPQ_TRKR (or SLPQ_TRK_RIGHT) having the high voltage (e.g., 1V), the wake-up detection circuit 185 may generate the wake up complete signal WAKEUP_DONE having the high voltage (e.g., 1V) to indicate that the memory device 100 is operating in the sleep state.

In the time period T2, the sleep control signal SLP has a low voltage (e.g., 0V) to initiate a wake-up sequence. The sleep control signal SLP having the low voltage (e.g., 0V) may cause the memory cells 125 to operate in the operational state. In the time period T2, the delay circuit 295 generates the delayed signal SLPQ_RIGHT having a low voltage (e.g., 0V) after a certain delay (e.g., delay associated with the delay circuit 295) from the sleep control signal transitioning to the low voltage (e.g., 0V). In the time period T2, the power switch SW is enabled, when the SLPQ_RIGHT has a low voltage (e.g., 0V). By enabling the power switch SW, the internal supply voltage VDDI may increase towards a high voltage (e.g., 1V) to enable the latch circuit 350 of the output driver 280. However, because of capacitive loads of the output drivers 280, the internal supply voltage VDDI may not change immediately. Hence, the power detection circuit 520 may maintain the power detection signal VDDI_RDYB having the high voltage (e.g., 1V), because the internal supply voltage VDDI may be still lower than the threshold voltage. In the time period T2, the delayed sleep tracking signal SLPQ_TRKR (or SLPQ_TRK_RIGHT) following or delayed from the sleep tracking signal SLP TRK may be transitioned from the high voltage (e.g., 1V) to the low voltage (e.g., 0V) after a certain delay (e.g., delay associated with the delay circuits 290B, 292). In the time period T2, in response to i) the delayed sleep tracking signal SLPQ_TRKR (or SLPQ_TRK_RIGHT) having the high voltage (e.g., 1V) during a first portion of the time period T2 before transitioning to the low voltage (e.g., 0V) and ii) the power detection signal VDDI_RDYB having the high voltage (e.g., 1V) during a second portion of the time period T2, the wake up detection circuit 185 may generate or maintain the wake up complete signal WAKEUP_DONE having the high voltage (e.g., 1V) to indicate that the memory device 100 is still operating in the sleep state or the wake up sequence has not completed yet.

In the time period T3, the power detection circuit 520 may detect that the supply voltage VDDI is larger than the threshold voltage and generate the power detection signal VDDI_RDYB having the low voltage (e.g., 0V) to indicate that the output drivers 280 have sufficient power or internal supply voltage VDDI to be operational. In the time period T3, in response to the delayed sleep tracking signal SLPQ_TRKR (or SLPQ_TRK_RIGHT) having the low voltage (e.g., 0V) and the power detection signal VDDI_RDYB having the low voltage (e.g., 0V), the wake up detection circuit 185 may generate the wake up complete signal WAKEUP_DONE having the low voltage (e.g., 0V) to indicate that the wake up sequence has completed and the memory device 100 is operating in the operational state.

Advantageously, the wake-up detection circuit 185 may generate the wake up complete signal WAKEUP_DONE accurately, when the memory cell 125 and the output driver 280 have transitioned from the sleep state to the operational state. In one aspect, the internal supply voltage VDDI provided to the one or more circuits of the output driver 280 may change, in response to the sleep control signal SLP. For example, the internal supply voltage VDDI may be set to a first voltage (e.g., 0V) when the sleep control signal SLP has a second voltage (e.g., 1V) causing the output driver 280 to be in the sleep state, and may be set to the second voltage (e.g., 1V) when the sleep control signal SLP has the first voltage (e.g., 0V) causing the output driver 280 to be in the operational state. Due to capacitive loading, the change in the internal supply voltage VDDI may be delayed with respect to the change in the sleep control signal SLP or the control signal SLPQ_RIGHT. By causing the wake-up detection circuit 185 to generate the wake up complete signal WAKEUP_DONE based on the delayed signal 335 and the power detection signal VDDI_RDYB, the wake up complete signal WAKEUP_DONE can be generated accurately when the internal supply voltage VDDI has reached a sufficient voltage for the output driver 280 to be operational. Accordingly, prematurely causing other operations such as reading data stored by the memory cell 125 before the memory cell 125 and the output driver 280 have sufficiently transitioned from the sleep state to the operational state can be obviated, such that the memory device 100 can operate in a reliable manner with reduced power consumption.

Figure 8:
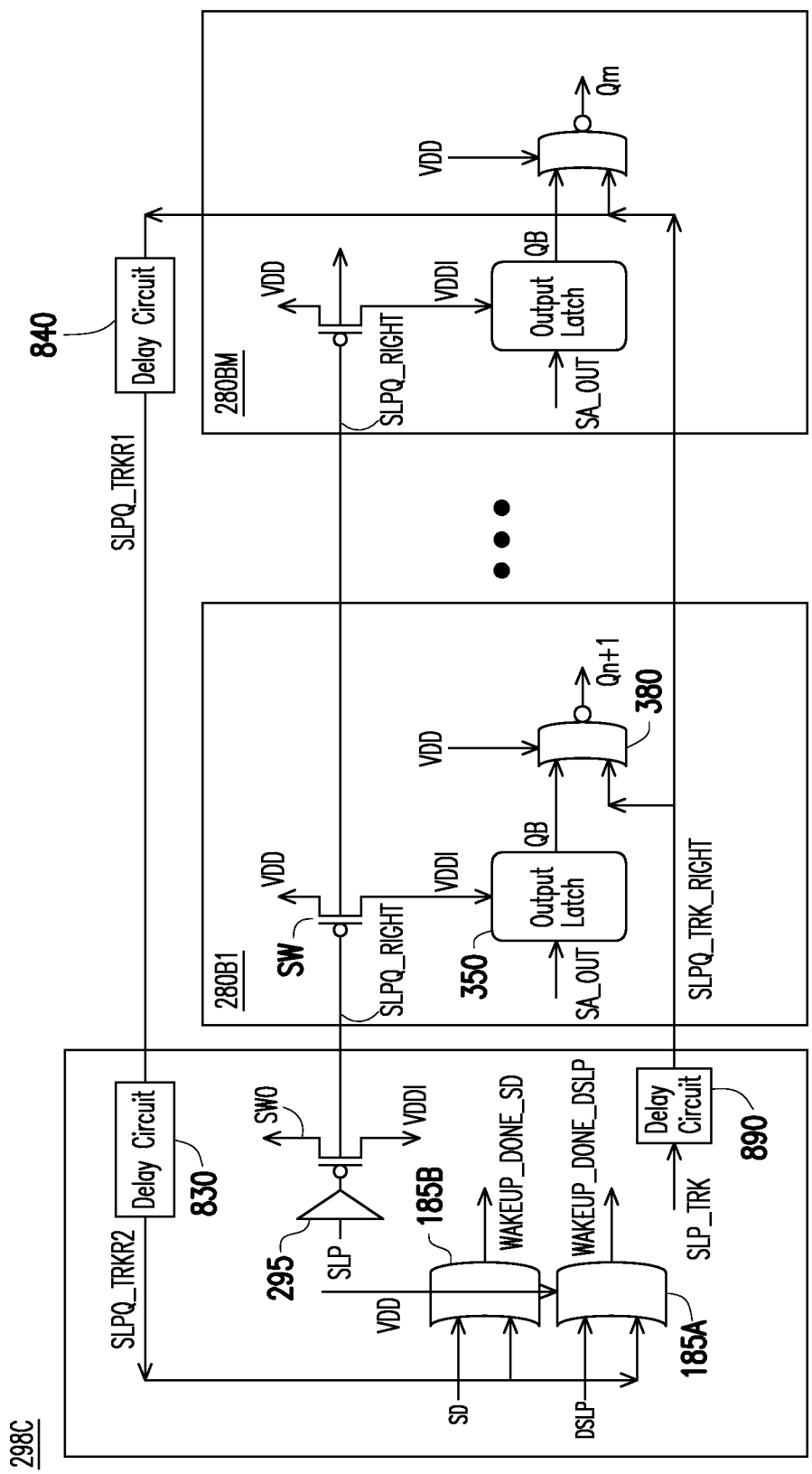
FIG. 8 illustrates a schematic diagram of a portion of the memory controller in FIG. 2, in accordance with some embodiments.
Figure 9A:
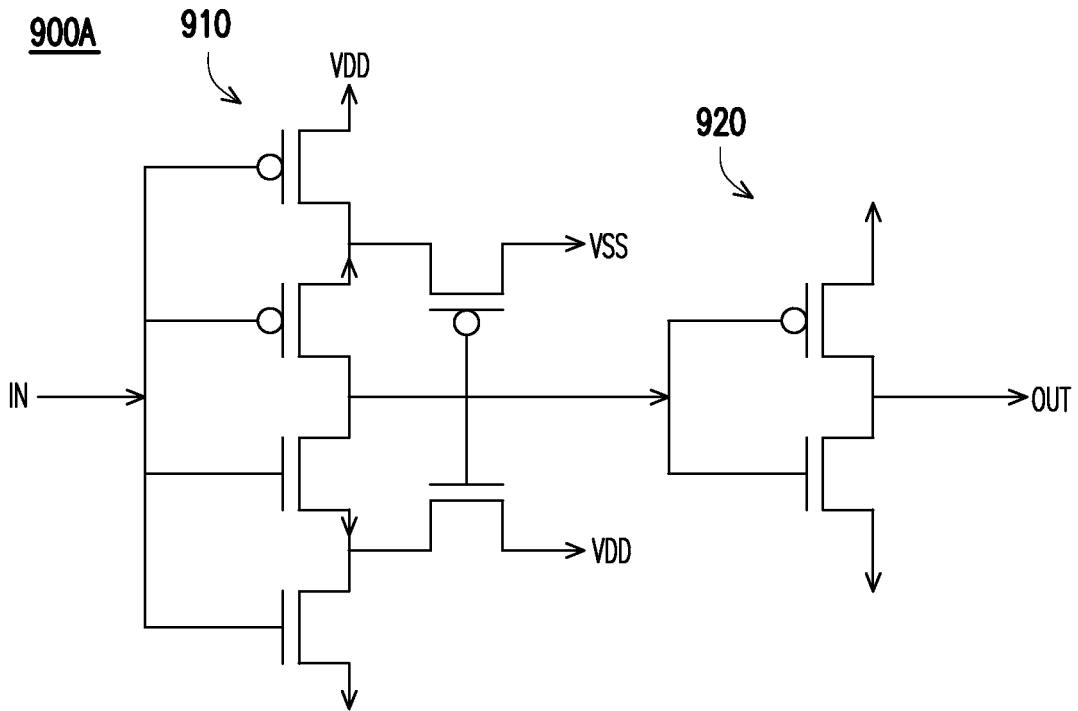
FIGS. 9A-9D illustrate schematic diagrams of delay circuits, in accordance with some embodiments.
Figure 9B:
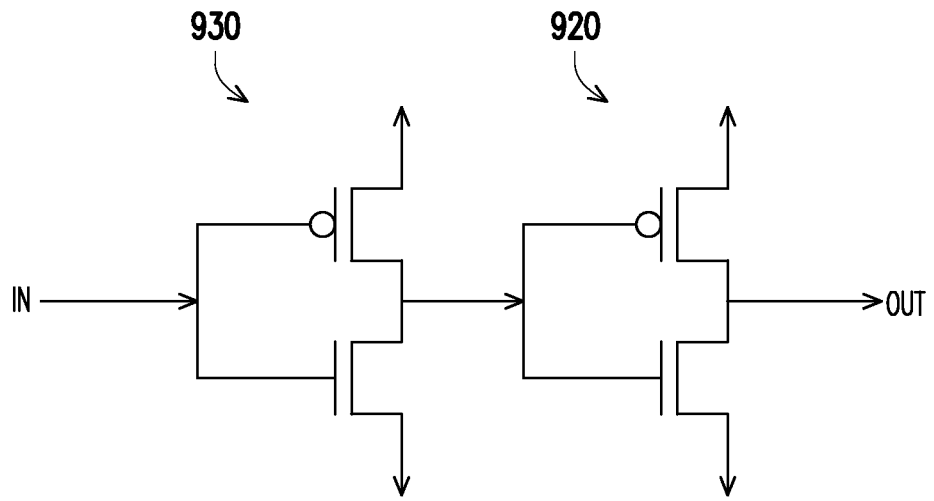
Figure 9C:
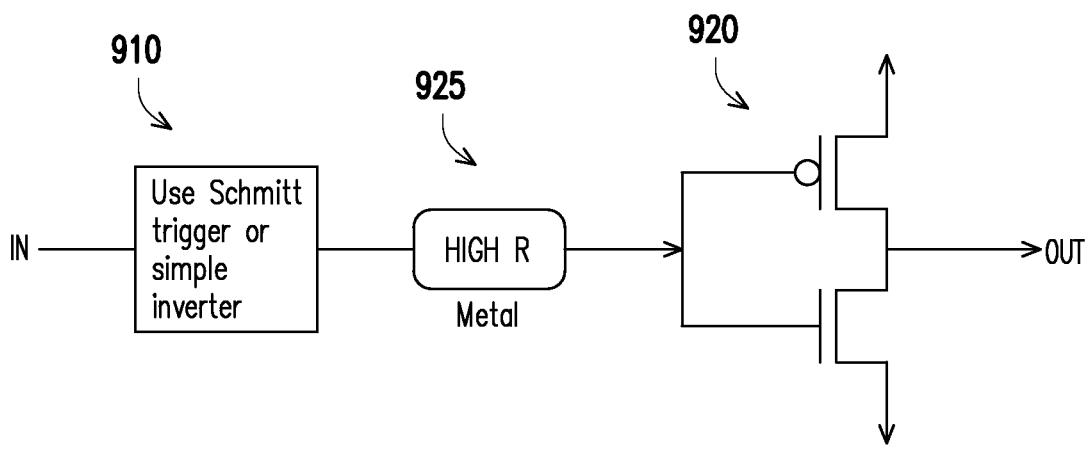
Figure 9D:
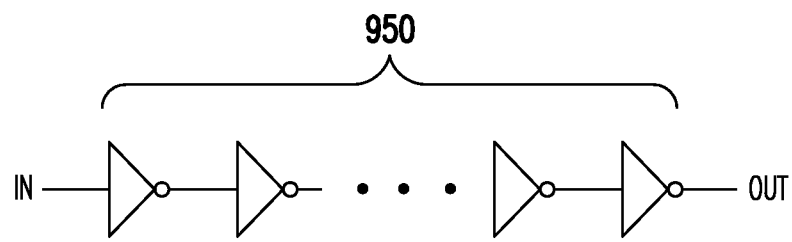

FIG. 8 illustrates a schematic diagram of a portion 298C of the memory controller 105 in FIG. 2, in accordance with some embodiments. In one aspect, the portion 298C of the memory controller 105 is similar to the portion 298A of the memory controller 105 in FIG. 3, except the memory controller 105 includes delay circuits 830, 840, 890 to replace the delay circuits 330, 292, 290B, respectively. Thus, detailed description of duplicated portion thereof is omitted herein for the sake of brevity. Each of the delay circuits 830, 840, 890 can be embodied as shown in FIGS. 9A-9D.

FIGS. 9A-9D illustrate schematic diagrams of delay circuits 900A . . . 900D, in accordance with some embodiments. Each of the delay circuits 900A . . . 900D can be implemented as one or more delay circuit disclosed herein. In some embodiments, the memory device 100 may implement a different delay circuit than shown in FIGS. 9A-9D. In some embodiments, the delay circuit 900A in FIG. 9A includes a first delay circuit 910 similar to the power detection circuit 520 or a Schmitt trigger shown in FIG. 6, and a second delay circuit 920 embodied as an inverter circuit. In some embodiments, the delay circuit 900B in FIG. 9B includes a first delay circuit 930 embodied as an inverter circuit, and the second delay circuit 920 embodied as an inverter circuit. In some embodiments, the delay circuit 900C in FIG. 9C includes the first delay circuit 910, the second delay circuit 920, and a resistive component 925 (e.g., metal rail or high resistive material) between the first delay circuit 910 and the second delay circuit 920. In one aspect, the resistive component 925 can be selected or adjusted to obtain a target delay. In some embodiments, the delay circuit 900D in FIG. 9D includes an even number of inverters 950 connected in cascade. In one aspect, a number of inverters 950 can be selected or adjusted to obtain a target delay.

Figure 10:
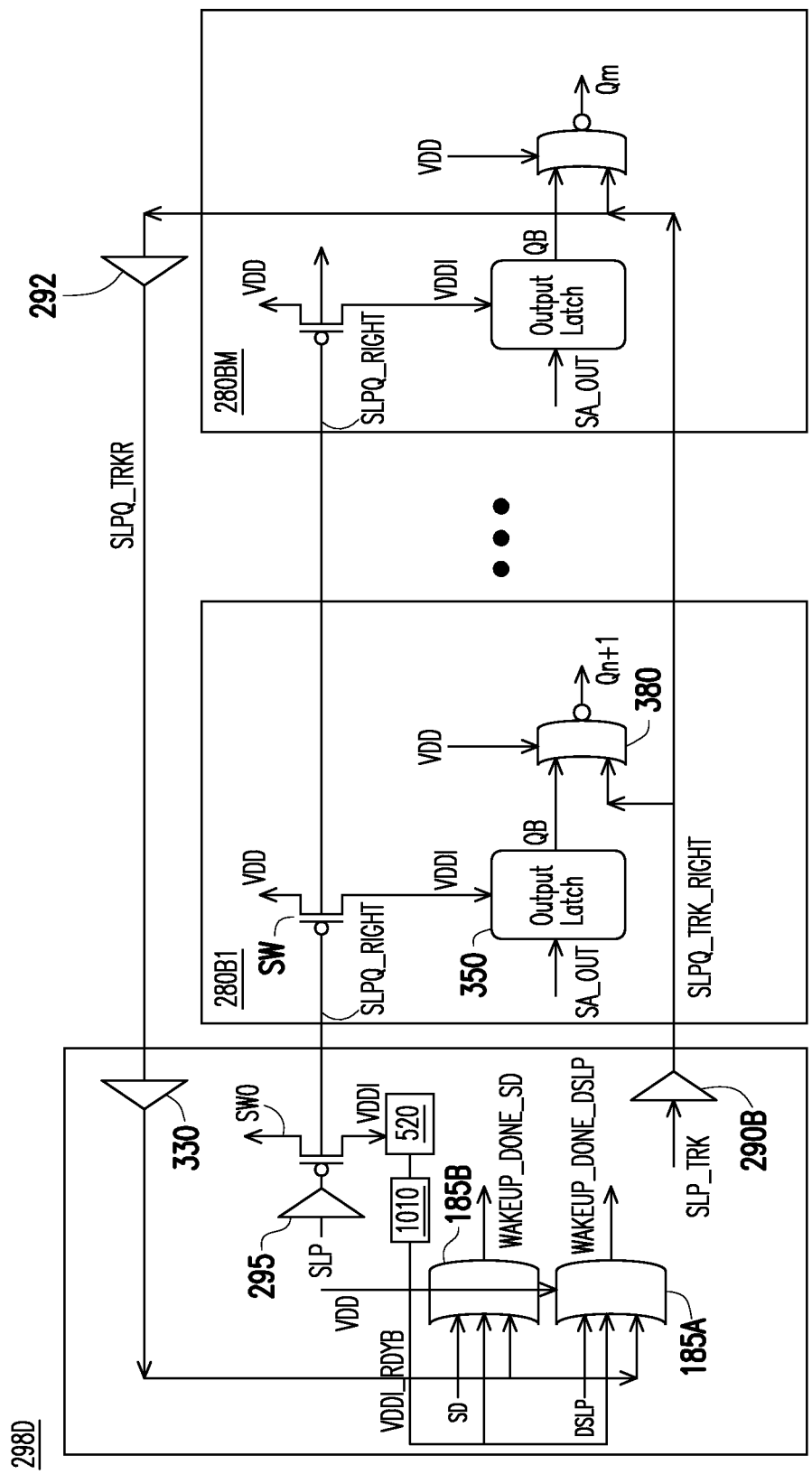
FIG. 10 illustrates a schematic diagram of a portion of the memory controller in FIG. 2, in accordance with some embodiments.

FIG. 10 illustrates a schematic diagram of the portion 298D of the memory controller 105 in FIG. 2, in accordance with some embodiments. In one aspect, the portion 298D of the memory controller 105 is similar to the portion 298B of the memory controller 105 in FIG. 3, except the memory controller 105 includes a delay circuit 1010 between the power detection circuit 520 and the wake-up detection circuits 185. Thus, detailed description of duplicated portion thereof is omitted herein for the sake of brevity. The delay circuit 1010 can be embodied as shown in FIGS. 9A-9D. In some embodiments, the delay circuit 1010 can be implemented as a variable delay circuit. By delaying the output of the power detection circuit 520, prematurely generating the wake-up complete signals WAKEUP_DONE (e.g., WAKEUP_DONE_SD, WAKEUP_DONE_DSLP) before the memory cells 125 and the output drivers 280 have sufficiently transitioned to the operational state can be obviated.

Figure 11:
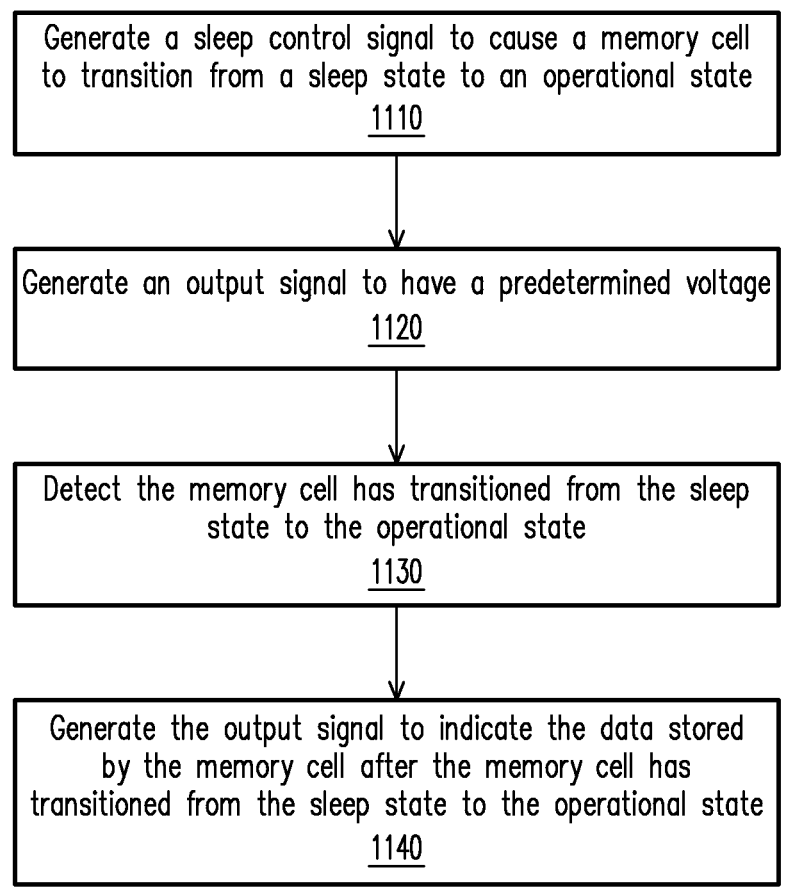
FIG. 11 is a flowchart showing a method of performing a wake-up sequence by a memory device, in accordance with some embodiments.

FIG. 11 is a flowchart showing a method 1100 of performing a wake-up sequence by a memory device, in accordance with some embodiments. In some embodiments, the method 1100 is performed by a controller (e.g., memory controller 105 or main controller 110). In some embodiments, the method 1100 is performed by other entities. In some embodiments, the method 1100 includes more, fewer, or different steps than shown in FIG. 11.

In one approach, the controller generates 1110 a sleep control signal (e.g., sleep control signal SLP) to cause a memory cell (e.g., memory cell 125) to transition from a sleep state to an operational state to initiate a wake-up sequence. For example, the memory array 120 includes buffer circuits 245A . . . 245C that propagate a sleep control signal SLP. The buffer circuits 245A . . . 245C may be connected in cascade to propagate the sleep control signal SLP for different memory cells 125.

In one approach, the controller generates 1120 an output signal (e.g., output signal Q) to have a predetermined voltage (e.g., 0V), irrespective of the data stored by the memory cell 125, in response to a sleep tracking signal indicating that the memory cell has not transitioned to the operational state yet. In one approach, an output driver (e.g., output circuit 380) of the controller receives a sleep tracking signal (e.g., SLP TRK). A sleep tracking signal may be delayed from the sleep control signal SLP. For example, the sleep tracking signal may be a last delayed signal from last buffer circuit of the buffer circuits 245A . . . 245C. Hence, the sleep tracking signal may indicate that the last memory cell of a set of memory cells has transitioned from the sleep state to the operational state. Until the sleep tracking signal indicating that the memory cell has transitioned to the operational state, the output driver (e.g., output circuit 380) of the controller may generate and maintain the output signal to have the predetermined state.

In one approach, the controller detects 1130 the memory cell has transitioned from the sleep state to the operational state. In one approach, after a certain delay from the sleep control signal, the sleep tracking signal may indicate that the memory cell has complete a wake-up sequence and transitioned from the sleep state to the operational state.

In one approach, the controller generates 1140 the output signal to indicate the data stored by the memory cell after the memory cell has transitioned from the sleep state to the operational state. For example, in response to the sleep tracking signal indicating that the memory cell has transitioned to the operational state, the output driver (e.g., output circuit 380) of the controller may receive a signal indicative of data stored by the memory cell, for example, from a sense amplifier or a latch (e.g., 350) coupled to the sense amplifier, and generate the output signal indicating the data.

Advantageously, the memory device can reduce power consumption when transitioning from the sleep state to the operational state. In one aspect, causing the output driver to generate the output signal having the predetermined voltage in response to the sleep control signal may cause the output driver to consume power when the memory cell has not sufficiently transitioned from the sleep state to the operational state. By causing the output driver to generate the output signal having the predetermined voltage in response to the sleep tracking signal, power consumption of the output driver when the memory cell has not sufficiently transitioned from the sleep state to the operational state can be reduced or obviated.

Figure 12:
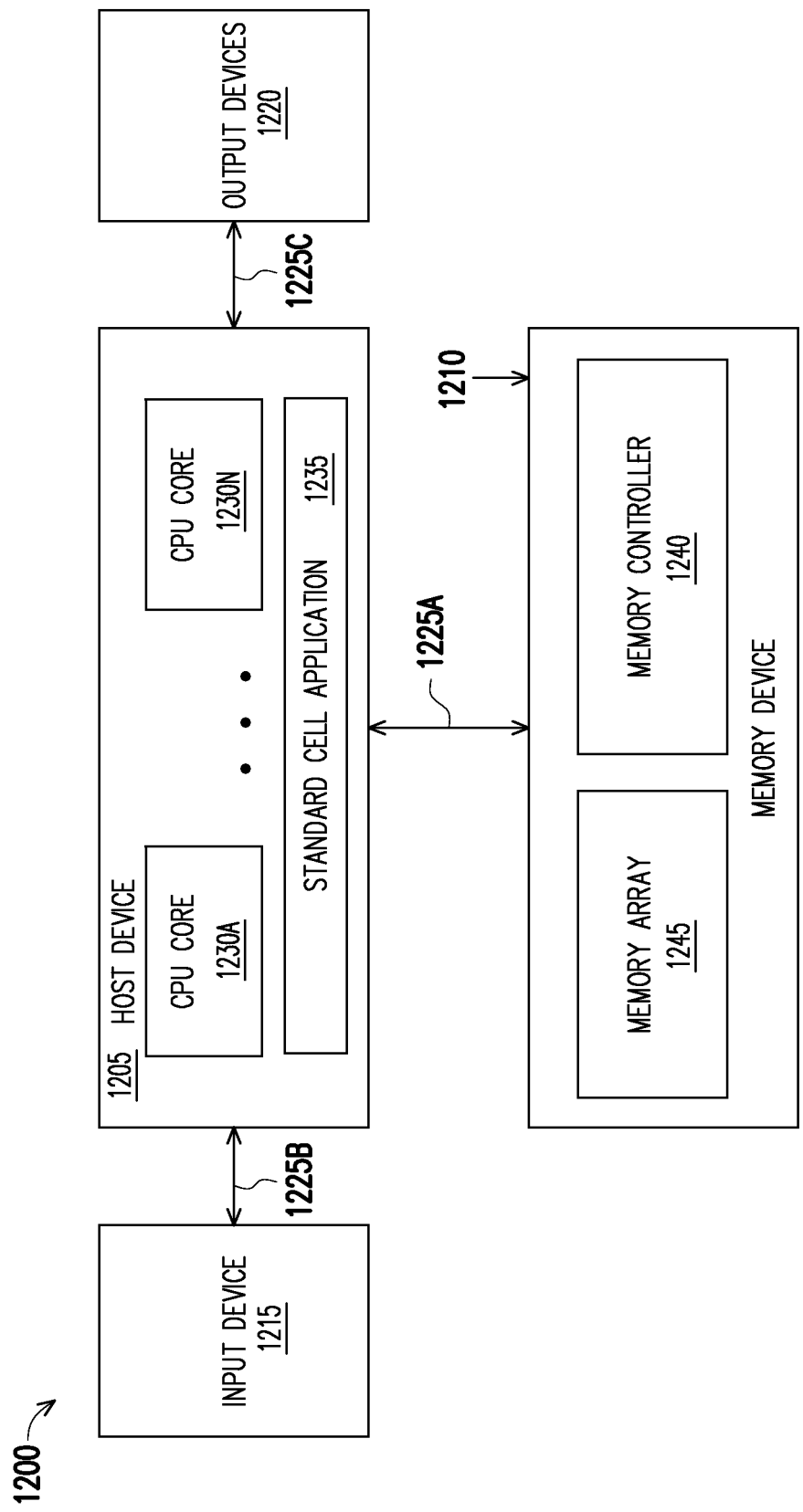
FIG. 12 is an example block diagram of a computing system, in accordance with some embodiments.

Referring now to FIG. 12, an example block diagram of a computing system 1200 is shown, in accordance with some embodiments of the disclosure. The computing system 1200 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1200 includes a host device 1205 associated with a memory device 1210. The host device 1205 may be configured to receive input from one or more input devices 1215 and provide output to one or more output devices 1220. The host device 1205 may be configured to communicate with the memory device 1210, the input devices 1215, and the output devices 1220 via appropriate interfaces 1225A, 1225B, and 1225C, respectively. The computing system 1200 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1205.

The input devices 1215 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1205 and that allows an external source, such as a user (e.g., a circuit or layout designer), to enter information (e.g., data) into the host device and send instructions to the host device. Similarly, the output devices 1220 may include a variety of output technologies such as external memories, printers, speakers, displays, microphones, light emitting diodes, headphones, video devices, and any other output peripherals that are configured to receive information (e.g., data) from the host device 1205. The "data" that is either input into the host device 1205 and/or output from the host device may include any of a variety of textual data, circuit data, signal data, semiconductor device data, graphical data, combinations thereof, or other types of analog and/or digital data that is suitable for processing using the computing system 1200.

The host device 1205 includes or is associated with one or more processing units/processors, such as Central Processing Unit ("CPU") cores 1230A . . . 1230N. The CPU cores 1230A . . . 1230N may be implemented as an Application Specific Integrated Circuit ("ASIC"), Field Programmable Gate Array ("FPGA"), or any other type of processing unit. Each of the CPU cores 1230A . . . 1230N may be configured to execute instructions for running one or more applications of the host device 1205. In some embodiments, the instructions and data to run the one or more applications may be stored within the memory device 1210. The host device 1205 may also be configured to store the results of running the one or more applications within the memory device 1210. Thus, the host device 1205 may be configured to request the memory device 1210 to perform a variety of operations. For example, the host device 1205 may request the memory device 1210 to read data, write data, update or delete data, and/or perform management or other operations. One such application that the host device 1205 may be configured to run may be a standard cell application 1235. The standard cell application 1235 may be part of a computer aided design or electronic design automation software suite that may be used by a user of the host device 1205 to use, create, or modify a standard cell of a circuit. In some embodiments, the instructions to execute or run the standard cell application 1235 may be stored within the memory device 1210. The standard cell application 1235 may be executed by one or more of the CPU cores 1230A . . . 1230N using the instructions associated with the standard cell application from the memory device 1210. In one example, the standard cell application 1235 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 12, the memory device 1210 includes a memory controller 1240 that is configured to read data from or write data to a memory array 1245. The memory array 1245 may include a variety of volatile and/or non-volatile memories. For example, in some embodiments, the memory array 1245 may include NAND flash memory cores. In other embodiments, the memory array 1245 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D) (Point memory cores, ferroelectric random-access memory (FeRAM) cores, and other types of memory cores that are suitable for use within the memory array. The memories within the memory array 1245 may be individually and independently controlled by the memory controller 1240. In other words, the memory controller 1240 may be configured to communicate with each memory within the memory array 1245 individually and independently. By communicating with the memory array 1245, the memory controller 1240 may be configured to read data from or write data to the memory array in response to instructions received from the host device 1205. Although shown as being part of the memory device 1210, in some embodiments, the memory controller 1240 may be part of the host device 1205 or part of another component of the computing system 1200 and associated with the memory device 1210. The memory controller 1240 may be implemented as a logic circuit in either software, hardware, firmware, or combination thereof to perform the functions described herein. For example, in some embodiments, the memory controller 1240 may be configured to retrieve the instructions associated with the standard cell application 1235 stored in the memory array 1245 of the memory device 1210 upon receiving a request from the host device 1205.

It is to be understood that only some components of the computing system 1200 are shown and described in FIG. 12. However, the computing system 1200 may include other components such as various batteries and power sources, networking interfaces, routers, switches, external memory systems, controllers, etc. Generally speaking, the computing system 1200 may include any of a variety of hardware, software, and/or firmware components that are needed or considered desirable in performing the functions described herein. Similarly, the host device 1205, the input devices 1215, the output devices 1220, and the memory device 1210 including the memory controller 1240 and the memory array 1245 may include other hardware, software, and/or firmware components that are considered necessary or desirable in performing the functions described herein.

In one aspect of the present disclosure, a memory device is disclosed. In some embodiments, the memory device includes a memory cell to store data. In some embodiments, the memory device includes an output driver coupled to the memory cell. In some embodiments, the output driver is configured to: generate an output signal indicating the stored data, in response to a sleep tracking signal indicating that the memory cell is in an operational state and generate the output signal having a predetermined voltage irrespective of the stored data, in response to the sleep tracking signal indicating that the memory cell is in a sleep state. In some embodiments, the sleep tracking signal is delayed from a sleep control signal causing the memory cell to operate in the sleep state or the operational state.

In another aspect of the present disclosure, a memory device is disclosed. In some embodiments, the memory device includes a memory cell to store data. In some embodiments, the memory device includes a delay circuit configured to receive a sleep tracking signal indicating whether the memory cell is in a sleep state or in an operational state and delay the sleep tracking signal to obtain a delayed sleep tracking signal. In some embodiments, the memory device includes a wake-up detection circuit coupled to the delay circuit. In some embodiments, the wake-up detection circuit is configured to generate a wake up complete signal indicating whether a transition from the sleep state to the operational state by the memory cell is complete, based on the delayed sleep tracking signal.

In yet another aspect of the present disclosure, a method of operating a memory device is disclosed. In some embodiments, the method includes generating, by a controller, a sleep control signal to cause a memory cell to transition from a sleep state to an operational state at a first time. In some embodiments, the method includes detecting, by the controller, the memory cell has transitioned from the sleep state to the operational state at a second time after the first time. In some embodiments, the method includes causing, by the controller, an output driver coupled to the memory cell to maintain an output signal to have a predetermined voltage irrespective of data stored by the memory cell, until the second time. In some embodiments, the method includes causing, by the controller, the output driver to generate the output signal indicating the data stored by the memory cell after the second time.

The term "coupled" and variations thereof includes the joining of two members directly or indirectly to one another. The term "electrically coupled" and variations thereof includes the joining of two members directly or indirectly to one another through conductive materials (e.g., metal or cupper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   an output driver coupled to a memory cell storing data;
   wherein the output driver is configured to generate an output signal having a predetermined voltage irrespective of the stored data, in response to a sleep tracking signal indicating that the memory cell is in a sleep state; and
   wherein the sleep tracking signal is delayed from a sleep control signal and configured to causing the memory cell to operate in the sleep state or the operational state.

2. The memory device of claim 1, wherein the output driver includes:
   a NOR circuit including a first input to receive a signal indicative of the data stored by the memory cell and a second input to receive the sleep tracking signal.

3. The memory device of claim 1, further comprising:
a sleep control circuit configured to generate the sleep control signal causing the memory cell to transition from the sleep state to the operational state at a first time;
wherein the sleep tracking signal indicates that the memory cell has transitioned from the sleep state to the operational state at a second time after the first time.

4. The memory device of claim 3, wherein the output driver is configured to maintain the output signal at the predetermined voltage, until the sleep tracking signal indicates that the memory cell has transitioned from the sleep state to the operational state at the second time.

5. The memory device of claim 4, further comprising:
a delay circuit configured to delay the sleep tracking signal; and
a wake-up detection circuit coupled to the delay circuit, wherein the wake up detection circuit is configured to generate a wake up complete signal indicating whether a transition from the sleep state to the operational state by the memory cell is complete, based on the delayed sleep tracking signal.

6. The memory device of claim 5, wherein the delay circuit includes one or more buffer circuits.

7. The memory device of claim 5, wherein the output driver includes:
a power switch to provide a supply voltage to one or more circuits in the output driver, according to the sleep control signal.

8. The memory device of claim 7, further comprising:
a power detection circuit configured to generate a power detection signal indicating whether the supply voltage of the output driver has reached a threshold voltage.

9. The memory device of claim 8, wherein the wake-up detection circuit is configured to generate the wake up complete signal, further based on the power detection signal indicating that the supply voltage of the output driver has reached the threshold voltage.

10. The memory device of claim 8, wherein the wake-up detection circuit includes an OR gate including:
a first input to receive the sleep tracking signal; and
a second input to receive the power detection signal.

11. A memory device comprising:
an output driver coupled to a memory cell storing data, wherein the output driver is configured to generate an output signal having a predetermined voltage irrespective of the stored data, in response to a sleep tracking signal indicating that the memory cell is in a sleep state; and
a sleep control circuit configured to generate a sleep control signal causing the memory cell to transition from the sleep state to an operational state at a first time;
wherein the sleep tracking signal is delayed from the sleep control signal and configured to causing the memory cell to operate in the sleep state or the operational state.

12. The memory device of claim 11, wherein the sleep tracking signal indicates that the memory cell has transitioned from the sleep state to the operational state at a second time after the first time.

13. The memory device of claim 12, wherein the output driver is configured to maintain the output signal at the predetermined voltage, until the sleep tracking signal indicates that the memory cell has transitioned from the sleep state to the operational state at the second time.

14. The memory device of claim 13, further comprising:
a delay circuit configured to delay the sleep tracking signal; and
a wake-up detection circuit coupled to the delay circuit, wherein the wake up detection circuit is configured to generate a wake up complete signal indicating whether a transition from the sleep state to the operational state by the memory cell is complete, based on the delayed sleep tracking signal.

15. The memory device of claim 14, wherein the delay circuit includes one or more buffer circuits.

16. The memory device of claim 14, wherein the output driver includes:
a power switch to provide a supply voltage to one or more circuits in the output driver, according to the sleep control signal.

17. The memory device of claim 16, wherein the wake-up detection circuit is configured to generate the wake up complete signal, further based on the power detection signal indicating that the supply voltage of the output driver has reached the threshold voltage.

18. The memory device of claim 16, wherein the wake-up detection circuit includes an OR gate including:
a first input to receive the sleep tracking signal; and
a second input to receive the power detection signal.

19. A method comprising:
maintaining an output signal of an output driver coupled to a memory cell that stores data to have a predetermined voltage irrespective of the data stored by the memory cell, until the memory cell has transitioned from a sleep state to an operational state; and
generating the output signal indicating the data stored by the memory cell after the memory cell has transitioned from the sleep state to the operational state.

20. The method of claim 19, further comprising:
generating a sleep tracking signal indicating whether the memory cell is in the sleep state or in the operational state;
delaying the sleep tracking signal;
generating a wake-up complete signal indicating whether a transition from the sleep state to the operational state by the memory cell is complete, based on the delayed sleep tracking signal; and
generating a power detection signal indicating whether a supply voltage of the output driver has reached a threshold voltage.

* * * * *